United States Patent
Feng et al.

(10) Patent No.: US 11,127,355 B2
(45) Date of Patent: Sep. 21, 2021

(54) SHIFT REGISTER, GATE DRIVING CIRCUIT, DISPLAY DEVICE AND DRIVING METHOD

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/959,336

(22) PCT Filed: Nov. 27, 2019

(86) PCT No.: PCT/CN2019/121250
§ 371 (c)(1),
(2) Date: Jun. 30, 2020

(87) PCT Pub. No.: WO2020/108526
PCT Pub. Date: Jun. 4, 2020

(65) Prior Publication Data
US 2020/0357342 A1  Nov. 12, 2020

(30) Foreign Application Priority Data
Nov. 29, 2018 (CN) .......................... 201811442460.4

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0426* (2013.01); *G09G 2310/0286* (2013.01); *G09G 2310/08* (2013.01); *G09G 2320/0233* (2013.01)

(58) Field of Classification Search
CPC .. G09G 3/3208; G09G 3/3266; G09G 3/3674; G09G 2300/0426;
(Continued)

(56) References Cited

U.S. PATENT DOCUMENTS 5,287,393 A    2/1994  Miwada
2003/0231735 A1*  12/2003  Moon ..................... G11C 19/28
                                                           377/64
(Continued)

FOREIGN PATENT DOCUMENTS

CN    106683634 A    5/2017
CN    108648705 A    10/2018
(Continued)

OTHER PUBLICATIONS

The First Office Action with Search Report dated May 6, 2020 corresponding to Chinese application No. 201811442460.4.

*Primary Examiner* — Michael J Eurice
(74) *Attorney, Agent, or Firm* — Nath, Goldberg & Meyer; Joshua B. Goldberg

(57) ABSTRACT

Provided is shift register including signal input circuits, reset circuits and control and output circuit. Operation cycle of shift register is divided into phases non-overlapping in time, each phase includes at least first and second sub-phases. Signal input circuits are each configured to apply signal provided by respective signal input terminal to pull-up control terminal in first sub-phase of respective phase in response to signal of respective input control terminal. The reset circuits are each configured to apply first power supply signal provided by first power supply terminal to the pull-up
(Continued)

control terminal in second sub-phase of respective phase in response to signal of respective reset control terminal. The input circuits and the reset circuits share the control and output circuit outputting a signal based on signal of the pull-up control terminal, the waveform of the signal being superposition of waveforms corresponding to signals provided by the signal input circuits.

20 Claims, 8 Drawing Sheets

(58) Field of Classification Search
CPC ... G09G 2310/0267; G09G 2310/0286; G09G 2310/0289; G09G 2310/061; G09G 2310/08; G09G 2320/0233; G11C 19/28
See application file for complete search history.

(56) References Cited

U.S. PATENT DOCUMENTS

| | | | |
|---|---|---|---|
| 2007/0040793 A1* | 2/2007 | Kim | G09G 3/3677 345/100 |
| 2017/0193947 A1* | 7/2017 | Kim | G09G 3/3677 |

FOREIGN PATENT DOCUMENTS

| | | |
|---|---|---|
| CN | 108877627 A | 11/2018 |
| CN | 108877682 A | 11/2018 |
| CN | 109599144 A | 4/2019 |

* cited by examiner

# SHIFT REGISTER, GATE DRIVING CIRCUIT, DISPLAY DEVICE AND DRIVING METHOD

CROSS-REFERENCE TO RELATED APPLICATION

This is a National Phase Application filed under 35 U.S.C. 371 as a national stage of PCT/CN2019/121250, filed Nov. 27, 2019, an application claiming the benefit of Chinese Application No. 201811442460.4, filed Nov. 29, 2018, the content of each of which is hereby incorporated by reference in its entirety.

TECHNICAL FIELD

The present disclosure relates to the field of display technology, and in particular, to a shift register, a gate driving circuit including the shift register, a display device including the gate driving circuit, and a driving method of the display device.

BACKGROUND

For an organic light emitting diode display panel, a pixel circuit includes a driving transistor that drives an organic light emitting diode to emit light. Due to the non-uniform manufacturing process, the threshold voltages of the driving transistors in different pixels are not uniform, and therefore, the brightness of the light emitting diodes in different pixels in the same display panel are not uniform. In view of this, a compensation circuit is required.

A narrow-bezel display device is a market trend, and an excessively complex structure of a shift register is not favorable for realizing the narrow-bezel display device.

Therefore, it is necessary to simplify the structure of the shift register, particularly, the structure of the shift register having the compensation function.

SUMMARY

In an aspect, there is provided a shift register including: a plurality of signal input circuits coupled to a plurality of signal input terminals, a plurality of input control terminals, and a pull-up control terminal; a plurality of reset circuits coupled to a plurality of reset control terminals, a first power supply terminal, and the pull-up control terminal; a control and output circuit coupled to the pull-up control terminal, a pull-down control terminal, an output power supply terminal, an output clock signal terminal, and a signal output terminal, and configured to determine a voltage of the pull-down control terminal according to a voltage of the pull-up control terminal, output a signal provided by the output clock signal terminal through the signal output terminal in response to the voltage of the pull-up control terminal, and output a signal provided by the output power supply terminal through the signal output terminal in response to the voltage of the pull-down control terminal. An operation cycle of the shift register is divided into a plurality of phases, the plurality of phases are non-overlapping in time, and each of the plurality of phases includes at least a first sub-phase and a second sub-phase. The plurality of signal input circuits are each configured to apply, during the first sub-phase of a respective one of the plurality of phases, a signal provided by a respective one of the plurality of signal input terminals to the pull-up control terminal in response to a signal of a respective one of the plurality of input control terminals. The plurality of reset circuits are each configured to apply, during in the second sub-phase of a respective one of the plurality of phases, a first power supply signal provided by the first power supply terminal to the pull-up control terminal in response to a signal of a respective one of the plurality of reset control terminals.

In some embodiments, the control and output circuit includes: a pull-down control circuit coupled to the pull-up control terminal, the pull-down control terminal, the first power supply terminal, and a pull-down control clock terminal, and configured to apply a signal provided by one of the first power supply terminal and the pull-down control clock terminal to the pull-down control terminal according to the voltage of the pull-up control terminal; and an output circuit coupled to the signal output terminal, the output power supply terminal, the output clock signal terminal, the pull-up control terminal, and the pull-down control terminal, and configured to output a signal provided by the output clock signal terminal through the signal output terminal in response to the voltage of the pull-up control terminal, and output the signal provided by the output power supply terminal through the signal output terminal in response to the voltage of the pull-down control terminal.

In some embodiments, the operation cycle of the shift register is divided into a detection phase and a display phase, the plurality of signal input circuits include a first input circuit and a second input circuit, the plurality of signal input terminals include a first input terminal and a second input terminal, and the signal output terminal includes a cascade output terminal and a scan signal output terminal. The first input circuit is coupled to the cascade output terminal, a detection trigger terminal, the first input terminal, and the pull-up control terminal, and configured to apply, during a first sub-phase of the detection phase, a signal provided by the first input terminal to the pull-up control terminal in response to both the cascade output terminal and the detection trigger terminal receiving an active voltage level. The second input circuit is coupled to a display trigger terminal, the second input terminal, and the pull-up control terminal, and configured to apply, during a first sub-phase of the display phase, a signal provided by the second input terminal to the pull-up control terminal in response to the display trigger terminal receiving an active voltage level.

In some embodiments, the plurality of reset circuits include a first reset circuit and a second reset circuit, and the plurality of reset control terminals include a first reset control terminal and a second reset control terminal. The first reset circuit is coupled to the first reset control terminal, the first power supply terminal and the pull-up control terminal, and configured to provide, during a second sub-phase of the detection phase, the first power supply signal to the pull-up control terminal in response to a voltage of the first reset control terminal. The second reset circuit is coupled to the second reset control terminal, the first power supply terminal, and the pull-up control terminal, and configured to provide, during a second sub-phase of the display phase, the first power supply signal to the pull-up control terminal in response to a voltage of the second reset control terminal.

In some embodiments, the first input circuit includes: a detection control sub-circuit coupled to the cascade output terminal, the detection trigger terminal, and a detection control node, and configured to apply a signal provided by one of the cascade output terminal and the detection trigger terminal to the detection control node in response to the other one of the cascade output terminal and the detection trigger terminal receiving an active voltage level; a detection input sub-circuit coupled to the detection control node, the first input terminal, and the pull-up control terminal, and configured to apply a signal provided by the first input terminal to the pull-up control terminal in response to an active voltage level of the detection control node; and a detection storing sub-circuit coupled to the detection control node and the first power supply terminal, and configured to store a voltage at the detection control node.

In some embodiments, the first input circuit further includes: a detection reset sub-circuit coupled to the detection control node, a detection reset terminal, and the first power supply terminal, and configured to provide the first power supply signal to the detection control node in response to a voltage of the detection reset terminal.

In some embodiments, the detection control sub-circuit includes a detection control transistor, a control electrode of the detection control transistor is coupled to the detection trigger terminal, a first electrode of the detection control transistor is coupled to the cascade output terminal, and a second electrode of the detection control transistor is coupled to the detection control node.

In some embodiments, the detection control sub-circuit includes a detection control transistor, a control electrode of the detection control transistor is coupled to the cascade output terminal, a first electrode of the detection control transistor is coupled to the detection trigger terminal, and a second electrode of the detection control transistor is coupled to the detection control node.

In some embodiments, the detection input sub-circuit includes: a detection input transistor and a switching transistor. A control electrode of the detection input transistor is coupled to the detection control node, a first electrode of the detection input transistor is coupled to the first input terminal, and a second electrode of the detection input transistor is coupled to a first electrode of the switching transistor. A control electrode of the switching transistor is coupled to the first input terminal, and a second electrode of the switching transistor is coupled to the pull-up control terminal.

In some embodiments, the detection input sub-circuit includes: a detection input transistor, a switching transistor, and a detection leakage prevention transistor. A control electrode of the detection input transistor is coupled to the detection control node, a first electrode of the detection input transistor is coupled to the first input terminal, and a second electrode of the detection input transistor is coupled to a first electrode of the switching transistor. A control electrode of the switching transistor is coupled to a detection clock terminal, and a second electrode of the switching transistor is coupled to a first electrode of the detection leakage prevention transistor. A control electrode of the detection leakage prevention transistor is coupled to the detection clock terminal, the first electrode of the detection leakage prevention transistor is coupled to an intermediate leakage prevention node, and a second electrode of the detection leakage prevention transistor is coupled to the pull-up control terminal.

In some embodiments, the detection reset sub-circuit includes a detection reset transistor having a control electrode coupled to the detection reset terminal, a first electrode coupled to the detection control node, and a second electrode coupled to the first power supply terminal.

In some embodiments, the pull-down control circuit includes: at least one pull-down control input sub-circuit coupled to the pull-down control clock terminal and the pull-down control terminal, and configured to apply a signal provided by the pull-down control clock terminal to the pull-up control terminal; and a control sub-circuit coupled to the pull-up control terminal, the pull-down control terminal, and the first power supply terminal, and configured to determine the voltage of the pull-down control terminal as a voltage provided by one of the first power supply terminal and the pull-down control clock terminal according to the voltage of the pull-up control terminal.

In some embodiments, the control sub-circuit includes a first pull-down control transistor and a second pull-down control transistor. A control electrode of the first pull-down control transistor is coupled to the pull-up control terminal, a first electrode of the first pull-down control transistor is coupled to the pull-down control terminal, and a second electrode of the first pull-down control transistor is coupled to the first power supply terminal. A control electrode of the second pull-down control transistor is coupled to the pull-down control terminal, a first electrode of the second pull-down control transistor is coupled to the pull-up control terminal, and a second electrode of the second pull-down control transistor is coupled to the first power supply terminal.

In some embodiments, the control sub-circuit includes a first pull-down control transistor, a second pull-down control transistor, and a pull-down control leakage prevention transistor. A control electrode of the first pull-down control transistor is coupled to the pull-up control terminal, a first electrode of the first pull-down control transistor is coupled to the pull-down control terminal, and a second electrode of the first pull-down control transistor is coupled to the first power supply terminal. A control electrode of the second pull-down control transistor is coupled to the pull-down control terminal, a first electrode of the second pull-down control transistor is coupled to the pull-up control terminal, and a second electrode of the second pull-down control transistor is coupled to a first electrode of the pull-down control leakage prevention transistor. A control electrode of the pull-down control leakage prevention transistor is coupled to the pull-down control terminal, and a second electrode of the pull-down control leakage prevention transistor is coupled to the first power supply terminal.

In some embodiments, the pull-down control clock terminal includes a plurality of pull-down control clock terminals through which an active signal is provided at different phases. The pull-down control circuit includes a plurality of pull-down control input sub-circuits, each of which is coupled to the pull-down control terminal and one of the pull-down control clock terminals and configured to apply the signal provided by the pull-down control clock terminal to the pull-down control terminal in response to the pull-down control clock terminal receiving an active signal.

In some embodiments, each of the pull-down control input sub-circuits includes a pull-down control input transistor. A control electrode and a first electrode of the pull-down control input transistor are coupled to one of the pull-down control clock terminals, and a second electrode of the pull-down control input transistor is coupled to the pull-down control terminal.

In some embodiments, the output power supply terminal includes a second power supply terminal and the first power supply terminal. The output circuit includes: a cascade output sub-circuit coupled to the cascade output terminal, the output clock signal terminal, the pull-up control terminal, the pull-down control terminal, and the first power supply terminal, and configured to output a signal provided by the output clock signal terminal through the cascade output terminal in response to the voltage of the pull-up control terminal and output a signal provided by the first power supply terminal through the cascade output terminal in response to the voltage of the pull-down control terminal; and at least one scan signal output sub-circuit coupled to the scan signal output terminal, the output clock signal terminal, the pull-up control terminal, the pull-down control terminal, and the second power supply terminal, and configured to output a signal provided by the output clock signal terminal through the scan signal output terminal in response to the voltage of the pull-up control terminal and output a signal provided by the second power supply terminal through the scan signal output terminal in response to the voltage of the pull-down control terminal.

In some embodiments, the cascade output sub-circuit includes: a cascade output pull-up transistor, a cascade output pull-down transistor and a pull-up control capacitor. A control electrode of the cascade output pull-up transistor is coupled to the pull-up control terminal, a first electrode of the cascade output pull-up transistor is coupled to the output clock signal terminal, and a second electrode of the cascade output pull-up transistor is coupled to the cascade output terminal. A control electrode of the cascade output pull-down transistor is coupled to the pull-down control terminal, a first electrode of the cascade output pull-down transistor is coupled to the first power supply terminal, and a second electrode of the cascade output pull-down transistor is coupled to the cascade output terminal. A first electrode of the pull-up control capacitor is coupled to the pull-up control terminal, and a second electrode of the pull-up control capacitor is coupled to the cascade output terminal.

In some embodiments, the scan signal output sub-circuit includes a scan output pull-up transistor and a scan output pull-down transistor. A control electrode of the scan output pull-up transistor is coupled to the pull-up control terminal, a first electrode of the scan output pull-up transistor is coupled to the output clock signal terminal, and a second electrode of the scan output pull-up transistor is coupled to the scan signal output terminal. A control electrode of the scan output pull-down transistor is coupled to the pull-down control terminal, a first electrode of the scan output pull-down transistor is coupled to the second power supply terminal, and a second electrode of the scan output pull-down transistor is coupled to the scan signal output terminal.

In some embodiments, the first reset circuit includes: a first reset transistor having a control electrode coupled to the first reset control terminal, a first electrode coupled to the pull-up control terminal, and a second electrode coupled to the first power supply terminal. The second reset circuit includes a second reset transistor having a control electrode coupled to the second reset control terminal, a first electrode coupled to the pull-up control terminal, and a second electrode coupled to the first power supply terminal.

In some embodiments, the first reset circuit includes a first reset transistor having a control electrode coupled to the first reset control terminal, a first electrode coupled to the pull-up control terminal, and a second electrode coupled to the first power supply terminal. The second reset circuit includes a second reset transistor and a reset leakage prevention transistor, a control electrode of the second reset transistor is coupled to the second reset control terminal, a first electrode of the second reset transistor is coupled to the pull-up control terminal, a second electrode of the second reset transistor is coupled to a first electrode of the reset leakage prevention transistor, a control electrode of the reset leakage prevention transistor is coupled to the second reset control terminal, the first electrode of the reset leakage prevention transistor is coupled to an intermediate leakage prevention node, and a second electrode of the reset leakage prevention transistor is coupled to the first power supply terminal.

In some embodiments, the shift register further includes an intermediate leakage prevention transistor having a control electrode coupled to the pull-up control terminal, a first electrode electrically coupled to a third power supply terminal or the pull-up control terminal, and a second electrode coupled to the intermediate leakage prevention node.

In a second aspect, there is provided a gate driving circuit. The gate driving circuit includes a plurality of stages of cascaded shift registers, the shift registers each being the above shift register. The cascade output terminal of the (4n+1)-th stage of shift register is coupled to the display trigger terminal of the (4n+3)-th stage of shift register, the output clock signal terminal of the (4n+1)-th stage of shift register is coupled to a first output clock signal line for providing a first output clock signal, and the second reset control terminal of the (4n+1)-th stage of shift register is coupled to the cascade output terminal of the (4n+4)-th stage of shift register. The cascade output terminal of the (4n+2)-th stage of shift register is coupled to the display trigger terminal of the (4n+4)-th stage of shift register, the output clock signal terminal of the (4n+2)-th stage of shift register is coupled to a second output clock signal line for providing a second output clock signal, and the second reset control terminal of the (4n+2)-th stage of shift register is coupled to the cascade output terminal of the (4n+5)-th stage of shift register. The cascade output terminal of the (4n+3)-th stage of shift register is coupled to the display trigger terminal of the (4n+5)-th stage of shift register, the output clock signal terminal of the (4n+3)-th stage of shift register is coupled to a third output clock signal line for providing a third output clock signal, and the second reset control terminal of the (4n+3)-th stage of shift register is coupled to the cascade output terminal of the (4n+6)-th stage of shift register. The cascade output terminal of the (4n+4)-th stage of shift register is coupled to the display trigger terminal of the (4n+6)-th stage of shift register, the output clock signal terminal of the (4n+4)-th stage of shift register is coupled to a fourth output clock signal line for supplying a fourth output clock signal, and the second reset control terminal of the (4n+4)-th stage of shift register is coupled to the cascade output terminal of the (4n+7)-th stage of shift register.

In a third aspect, there is provided a display device including the above gate driving circuit.

In a fourth aspect, there is provided a driving method of a shift register, the shift register being the shift register described above. The operation cycle of the shift register is divided into a display phase and a detection phase that are non-overlapping in time, and each of the display phase and the detection phase includes a first sub-phase, a second sub-phase, and a third sub-phase. The driving method includes: in the first sub-phase of the display phase, applying, by the second input circuit, an active signal provided by the second input terminal to the pull-up control terminal in response to a signal of a display trigger terminal; in the second sub-phase of the display phase, determining, by the control and output circuit, the voltage of the pull-down control terminal as an inactive voltage in response to a signal of the pull-up control terminal, and outputting a signal provided by the output clock signal terminal through the signal output terminal in response to the signal of the pull-up control terminal; in the third sub-phase of the display phase, providing, by the second reset circuit, an inactive signal of the first power supply terminal to the pull-up control terminal in response to a signal of the second reset control terminal; in the first sub-phase of the detection phase, applying, by the first input circuit, an active signal provided by the first input terminal to the pull-up control terminal in response to signals of the detection trigger terminal and the signal output terminal; in the second sub-phase of the detection phase, determining, by the control and output circuit, the voltage of the pull-down control terminal as an inactive voltage in response to the signal of the pull-up control terminal, and outputting the signal provided by the output clock signal terminal through the signal output terminal in response to the signal of the pull-up control terminal; in the third sub-phase of the detection phase, providing, by the first reset circuit, the inactive signal of the first power supply terminal to the pull-up control terminal in response to a signal of the first reset control terminal.

BRIEF DESCRIPTION OF DRAWINGS

The accompanying drawings, which constitute a part of the specification, are provided for further understanding of the present disclosure, and for explaining the present disclosure together with the following specific implementations, but not intended to limit the present disclosure. In the drawings.

DETAILED DESCRIPTION

Specific implementations of the present disclosure will be further described in detail below in conjunction with the accompanying drawings and specific embodiments. It should be understood that the specific implementations described herein are merely for illustrating and explaining the present disclosure, but not for limiting the present disclosure.

Herein, when a signal or voltage level is referred to be "active", it means that the signal or voltage level can drive a corresponding transistor on and/or turn on a corresponding circuit, and when a signal or voltage level is referred to be "inactive", it means that the signal or voltage level can drive a corresponding transistor off and/or turn off a corresponding circuit. For example, for a P-type transistor, the active voltage level is a low level and the inactive voltage level is a high level; for an N-type transistor, the active voltage level is a high level and the inactive voltage level is a low level. In the following exemplary description, a case where all the transistors are N-type transistors, the active voltage level is a high level, and the inactive voltage level is a low level is described as an example, but the present disclosure is not limited thereto.

Figure 10:
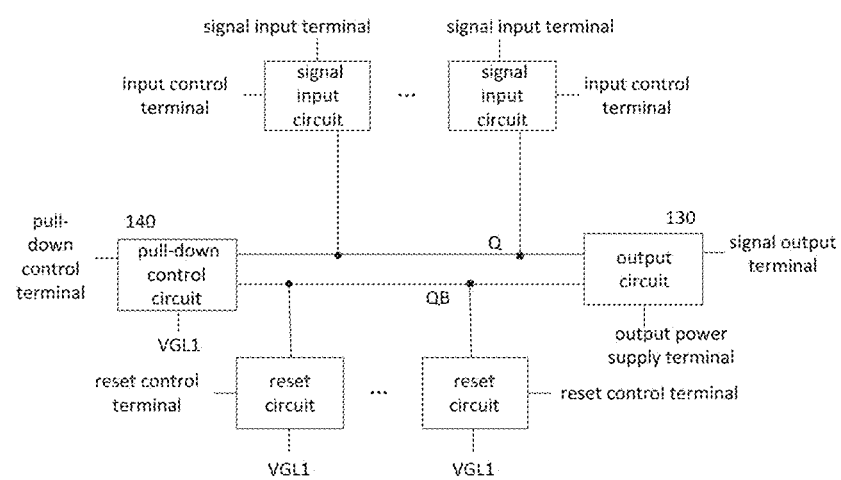
FIG. 10 is a block diagram of a shift register according to the present disclosure.

In an aspect, embodiments of the present disclosure provide a shift register. The shift register includes: a plurality of signal input circuits, a plurality of reset circuits, and a control and output circuit. In some embodiments, referring to FIG. 10, the control and output circuit may include a pull-down control circuit 140 and an output circuit 130.

The pull-down control circuit 140 is coupled to a pull-up control terminal Q, a pull-down control terminal QB, a first power supply terminal VGL1, and a pull-down control clock terminal, and configured to apply a signal provided by one of the first power supply terminal VGL1 and the pull-down control clock terminal to the pull-down control terminal QB according to a voltage of the pull-up control terminal Q. The first power supply terminal VGL1 is configured to supply a first power supply signal having a constant inactive voltage level.

The output circuit 130 is coupled to a signal output terminal, an output power supply terminal, an output clock signal terminal, the pull-up control terminal Q, and the pull-down control terminal QB, and configured to output a signal provided by the output clock signal terminal through the signal output terminal in response to the voltage of the pull-up control terminal Q, and output a signal provided by the output power supply terminal through the signal output terminal in response to a voltage of the pull-down control terminal QB. The output power supply terminal is configured to supply a constant inactive voltage level.

The plurality of signal input circuits are coupled to a plurality of signal input terminals, a plurality of input control terminals and the pull-up control terminal Q.

The plurality of reset circuits are coupled to a plurality of reset control terminals, the first power supply terminal VGL1, and the pull-up control terminal Q.

An operation cycle of the shift register according to the present disclosure is divided into a plurality of phases, the plurality of phases are non-overlapping in time, and each of the phases includes at least a first sub-phase and a second sub-phase. The plurality of signal input circuits are each configured to apply a signal provided by a respective one of the plurality of signal input terminals to the pull-up control terminal Q in a first sub-phase of a respective one of the plurality of phases in response to a signal of a respective one of the plurality of input control terminals. The plurality of reset circuits are each configured to apply the first power supply signal provided by the first power supply terminal VGL1 to the pull-up control terminal Q in a second sub-phase of a respective one of the plurality of phases in response to a signal of a respective one of the plurality of reset control terminals.

Figure 1:
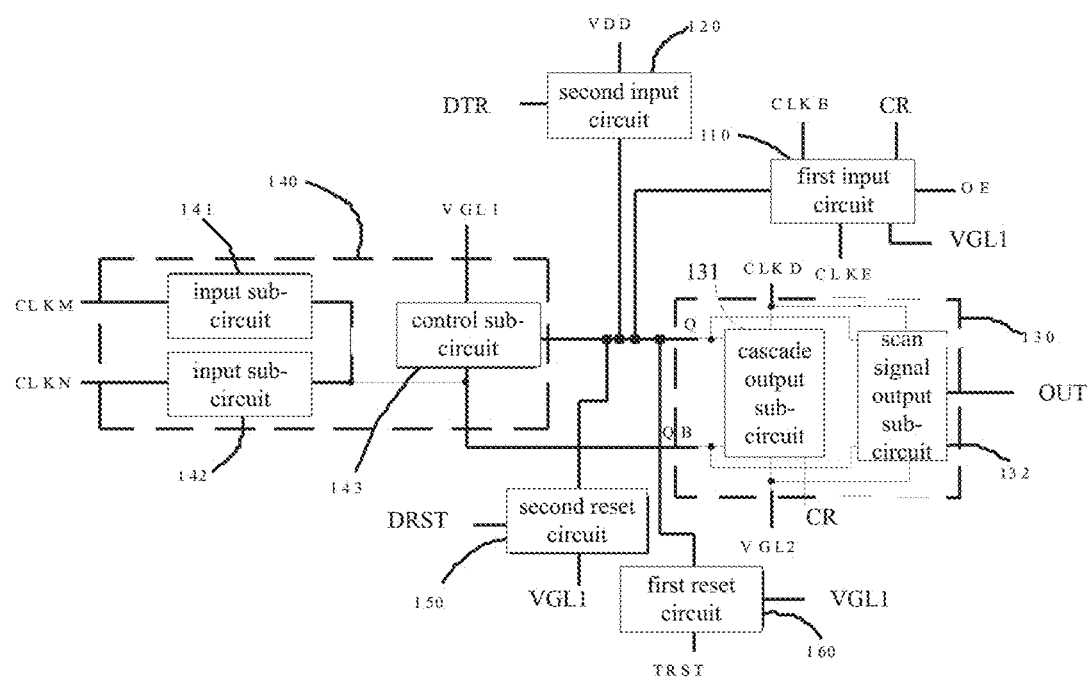
FIG. 1 is a block diagram of a shift register according to the present disclosure.

FIG. 1 shows an example of the shift register. The shift register shown in FIG. 1 includes a plurality of signal input circuits 110 and 120, a plurality of reset circuits 150 and 160, an output circuit 130, and a pull-down control circuit 140.

Figure 6:
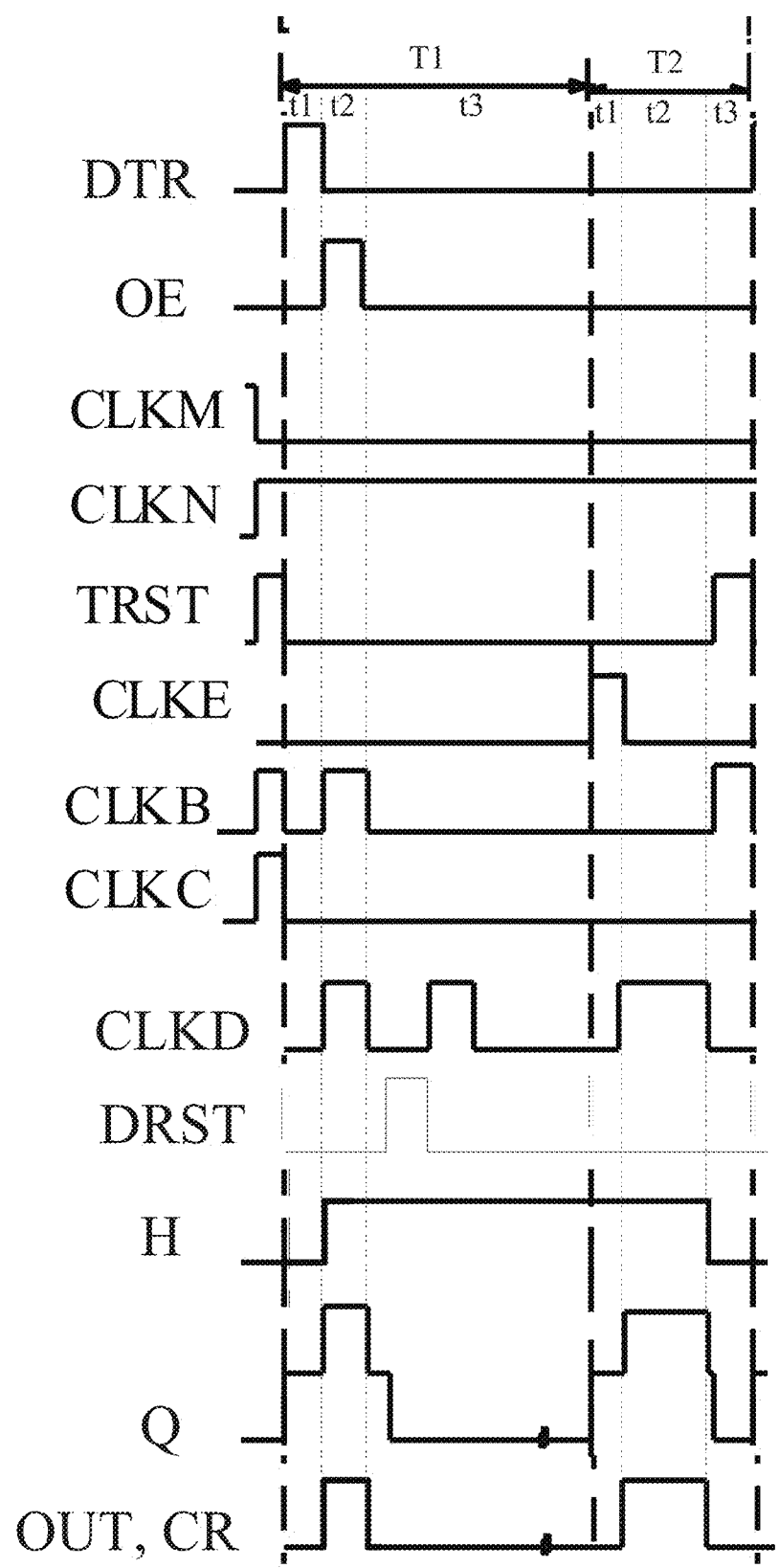
FIG. 6 is a timing diagram illustrating the operation of a shift register according to the present disclosure.

In the example shown in FIG. 1, the plurality of signal input terminals include a first input terminal CLKE and a second input terminal VDD, the plurality of input control terminals include a detection trigger terminal OE and a cascade output terminal CR as first input control terminals, and a display trigger terminal DTR as a second input control terminal, the plurality of reset control terminals include a first reset control terminal TRST and a second reset control terminal DRST, and the operation cycle of the shift register is divided into two phases that do not overlap in time: a display phase T1 and a detection phase T2 (see FIG. 6). However, the present disclosure is not limited thereto.

The first input circuit 110, which is a detection input circuit, is coupled to the cascade output terminal CR, the detection trigger terminal OE, the first input terminal CLKE, and the pull-up control terminal Q, and configured to apply a signal provided by the first input terminal CLKE to the pull-up control terminal Q in a first sub-phase of the detection phase T2 in response to the cascade output terminal CR and the detection trigger terminal OE both receiving an active voltage level.

The second input circuit 120, which is a display input circuit, is coupled to the display trigger terminal DTR, a third power supply terminal VDD, which is the second input terminal, and the pull-up control terminal Q, and configured to apply a signal provided by the third power supply terminal VDD to the pull-up control terminal Q in a first sub-phase of the display phase T1 in response to the display trigger terminal DTR receiving an active voltage level. The third power supply terminal VDD is configured to supply a third power supply signal having a constant active voltage level.

The first reset circuit 160 is coupled to the first reset control terminal TRST, the first power supply terminal VGL1, and the pull-up control terminal Q. and configured to supply the first power supply signal to the pull-up control terminal Q in a second sub-phase of the detection phase T2 in response to a voltage of the first reset control terminal TRST.

The second reset circuit 150 is coupled to the second reset control terminal DRST, the first power supply terminal VGL1, and the pull-up control terminal Q, and configured to supply the first power supply signal to the pull-up control terminal Q in a second sub-phase of the display phase T1 in response to a voltage of the second reset control terminal DRST.

In the example shown in FIG. 1, the plurality of signal input circuits 110 and 120 alternately supply signals to the pull-up control terminal Q during different time periods of one operation cycle, and accordingly, the plurality of reset circuits 150 and 160 alternately supply an inactive voltage level to the pull-up control terminal Q (i.e., reset the pull-up control terminal Q) during different time periods.

That is, in the shift register provided by the present disclosure, the output circuit and the pull-down control circuit are shared by the plurality of signal input circuits and the plurality of reset circuits, and therefore, the signal output by the signal output terminal is a superposition of signals output by the plurality of shift registers having only one signal input circuit.

Moreover, the plurality of signal input circuits and the plurality of reset circuits share the output circuit and the pull-down control circuit, and there is no need to arrange a connector, thereby simplifying the structure of the shift register and facilitating the realization of a narrow bezel.

For example, in the example shown in FIG. 1, the display scan signal and the detection scan signal may be both output through one signal output terminal (e.g., scan signal output terminal) of one shift register. Further, since the first input circuit 110 for providing the detection input signal is controlled by both the cascade output terminal CR and the detection trigger terminal OE, a random detection function can be realized, which will be described later.

In some embodiments, the signal output terminal includes the scan signal output terminal OUT and the cascade output terminal CR. The output circuit 130 includes a cascade output sub-circuit 131 and at least one scan signal output sub-circuit (e.g., 132 in FIGS. 1-4, or 132 and 133 in FIG. 5).

The cascade output sub-circuit 131 is coupled to the cascade output terminal CR, the output clock signal terminal CLKD, the pull-up control terminal Q, the pull-down control terminal QB, and the first power supply terminal VGL1, and configured to output a signal provided by the output clock signal terminal CLKD through the cascade output terminal CR in response to the voltage of the pull-up control terminal Q, and output the signal provided by the first power supply terminal VGL1 through the cascade output terminal CR in response to the voltage of the pull-down control terminal QB.

The scan signal output sub-circuit is coupled to the scan signal output terminal OUT, the output clock signal terminal CLKD, the pull-up control terminal Q, the pull-down control terminal QB, and the second power supply terminal VGL2, and configured to output a signal provided by the output clock signal terminal CLKD through the scan signal output terminal OUT in response to the voltage of the pull-up control terminal Q, and output the signal provided by the second power supply terminal VGL2 through the scan signal output terminal OUT in response to the voltage of the pull-down control terminal QB.

In the above example, the first and second power supply terminals VGL1 and VGL2 serve as the output power supply terminals, but the present disclosure is not limited thereto as long as the output power supply terminal(s) can provide a constant inactive level.

For each of the plurality of phases of one operation cycle of the shift register, one of the plurality of signal input circuits and one of the plurality of reset circuits is operating, and the phase may include a charging sub-phase t1 as the first sub-phase, an output sub-phase t2, and a pull-down sub-phase t3 as the second sub-phase (see FIG. 6).

In the charging sub-phase t1, a signal is provided to the pull-up control terminal Q by one of the plurality of signal input circuits to charge the pull-up control terminal Q. For example, in the charging sub-phase t1 of the display phase T1, a high level signal is provided to the node Q by the second input circuit 120, and in the charging sub-phase t1 of the detection phase T2, a high level signal is provided to the node Q by the first input circuit 110. An inactive first clock signal is provided to the output clock signal terminal CLKD, and the output circuit 130 outputs the inactive first clock signal through the signal output terminals (e.g., CR and OUT).

In the output sub-phase t2, the signal input circuit no longer provides a signal to the pull-up control terminal Q, so that the pull-up control terminal Q is floating, the potential of the pull-up control terminal Q is still high, and thus the output circuit 130 maintains outputting the first clock signal through the signal output terminal (e.g., CR and OUT). During the output sub-phase t2, the first clock signal is an active signal, such that the signal output terminal can output an active signal, and the pull-down control circuit 140 pulls down the voltage level of the pull-down control terminal QB according to the voltage level of the pull-up control terminal Q during the output sub-phase t2.

In the pull-down sub-phase t3, the first clock signal is a low level signal, and the voltage level of the pull-up control terminal Q is initially high. Then, one of the plurality of reset circuits supplies the first power supply signal to the pull-up control terminal Q, for example, during the pull-down sub-phase t3 of the display phase T1, the second reset circuit 150 pulls down the level of the pull-up control terminal Q in response to the high level of the second reset control terminal DRST, and during the pull-down sub-phase t3 of the detection phase T2, the first reset circuit 160 pulls down the level of the pull-up control terminal Q in response to the high level of the first reset control terminal TRST. At this time, since the voltage level of the pull-up control terminal Q is inactive, the pull-down control circuit 140 applies a signal of the pull-down control clock terminal to the pull-down control terminal QB, such that the voltage level of the pull-down control terminal QB is active. The output circuit 130 outputs the inactive voltage level provided by the output power supply terminal to the signal output terminal under the control of the active voltage level of the pull-down control terminal QB.

When each signal input circuit provides a signal to the pull-up control terminal Q the shift register enters the charging sub-phase t1, and goes through the output sub-phase t2 and the pull-down sub-phase t3. In other words, the operation sequence of the charging sub-phase, the output sub-phase and the pull-down sub-phase is repeated for multiple times in one operation cycle of the shift register, so that the shift register can output the superposition of multiple scan signals.

In some embodiments, pull-down control circuit 140 may include a control sub-circuit 143 and at least one input sub-circuit. The input sub-circuit is coupled to the pull-down control clock terminal and the pull-down control terminal QB, and configured to apply a signal provided by the pull-down control clock terminal to the pull-up control terminal Q. The control sub-circuit 143 is coupled to the pull-up control terminal Q, the pull-down control terminal QB, and the first power supply terminal VGL1, and configured to determine the voltage of the pull-down control terminal QB as the voltage provided by one of the first power supply terminal VGL1 and the pull-down control clock terminal, according to the voltage of the pull-up control terminal Q.

To extend the lifetime of the pull-down control sub-circuit 140, in some embodiments, the pull-down control sub-circuit 140 includes a control sub-circuit 143 and a plurality of input sub-circuits (e.g., two input sub-circuits 141 and 142 in the example of FIG. 1), and the shift register includes a plurality of pull-down control clock terminals (e.g., the shift register includes a first pull-down control clock terminal CLKM and a second pull-down control clock terminal CLKN in the example of FIG. 1).

The plurality of input sub-circuits are respectively configured to provide active pull-down control signals to the pull-down control terminal in different time periods. At any operating time of the shift register, the control sub-circuit 143 and one of the input sub-circuits form a functionally complete pull-down control circuit 140, and the rest of the input sub-circuits are in an idle state. The plurality of input sub-circuits are alternately powered, so the service life of a single input sub-circuit can be extended.

Each of the input sub-circuits is electrically coupled to a corresponding one of the pull-down control clock terminals and the pull-down control terminal QB, and configured to apply the signal provided by the pull-down control clock terminal to the pull-down control terminal QB in response to the pull-down control clock terminal receiving an active signal. It should be explained that, when the shift register is in operation, one of the pull-down control clock terminals in the shift register receives an active pull-down control clock signal, and the other one(s) of the pull-down control clock terminals each receive an inactive pull-down control clock signal.

In the pull-down sub-phase t3, the active pull-down control clock signal may be provided to the pull-down control terminal QB by the input sub-circuit.

When the shift register has operated for a period of time, the inputting of an active pull-down control clock signal to the input sub-circuit that is currently receiving an active pull-down control clock signal may be stopped, and an active pull-down control clock signal may be provided to one of the input sub-circuits that are not receiving an active pull-down control clock signal.

For example, in the embodiment shown in FIG. 1, the pull-down control sub-circuit 140 includes two pull-down control clock terminals, which are a first pull-down control clock terminal CLKM and a second pull-down control clock terminal CLKN, respectively, and the pull-down control sub-circuit 140 includes an input sub-circuit 141 electrically coupled to the first pull-down control clock terminal CLKM and an input sub-circuit 142 electrically coupled to the second pull-down control clock terminal CLKN.

In the present disclosure, there is no particular requirement for the time when the active pull-down control clock signal is provided to the first pull-down control clock terminal CLKM and the time when the active clock signal is provided to the second pull-down control clock terminal CLKN. For example, an interchange occurs every 100 frames, that is, the first pull-down control clock terminal CLKM is supplied with an active pull-down control clock signal when the first 100 frames of pictures are displayed, the second pull-down control clock terminal CLKN is supplied with an active pull-down control clock signal when the 200th to 300th frames of pictures are displayed, and so on.

In the present disclosure, there is no particular limitation to a specific structure of the input sub-circuit, and in some embodiments, the input sub-circuit may include a pull-down control input transistor, a gate electrode and a first electrode of the pull-down control input transistor are electrically coupled to a corresponding pull-down control clock terminal, and a second electrode of the pull-down control input transistor is electrically coupled to the pull-down control terminal Q.

Figure 2:
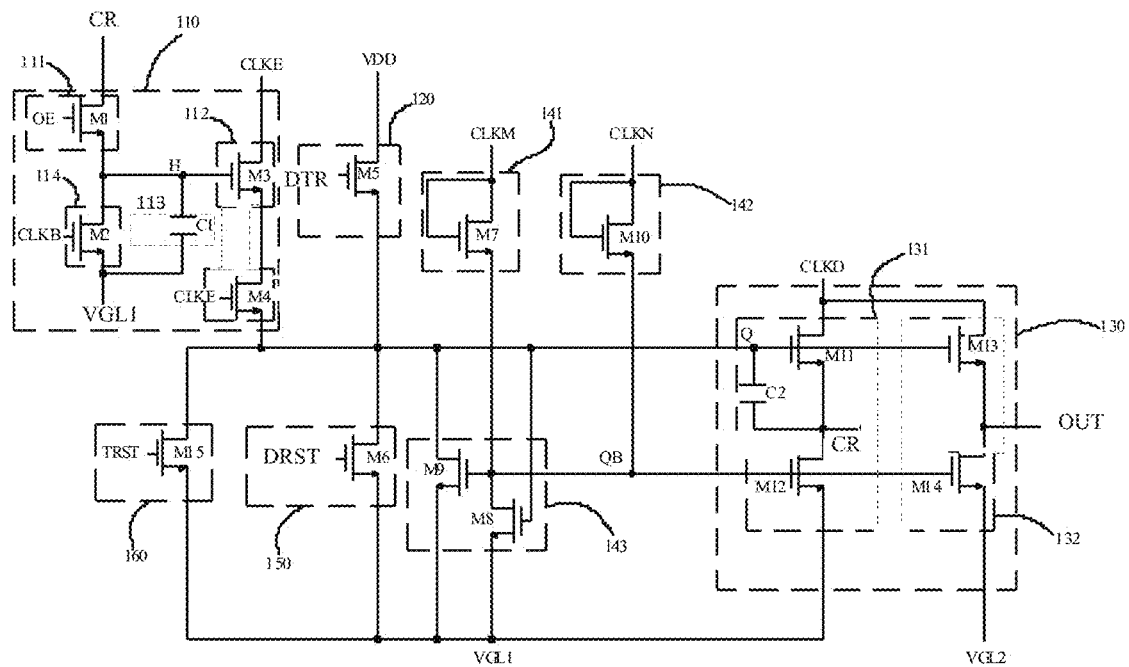
FIG. 2 is a circuit diagram of a shift register according to the present disclosure.
Figure 3:
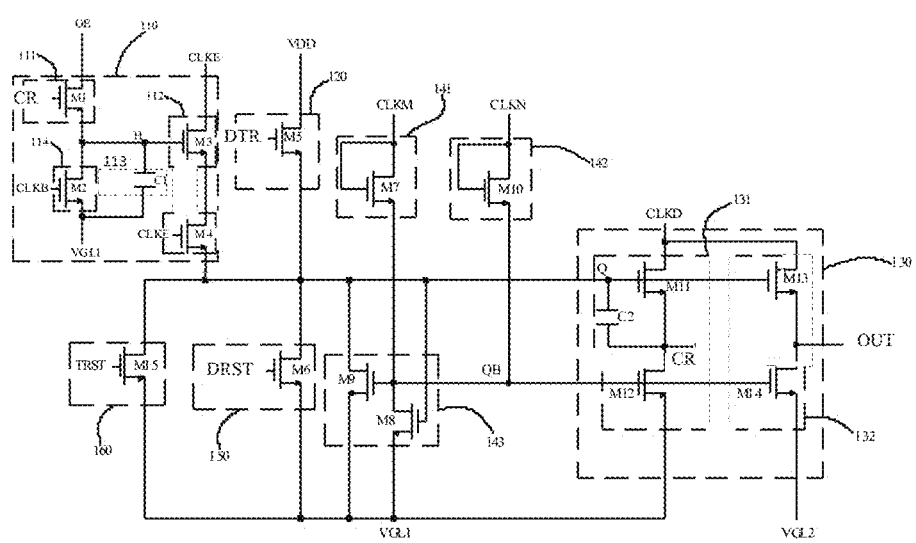
FIG. 3 is a circuit diagram of a shift register according to the present disclosure.

In some embodiments, for example, referring to FIGS. 2 and 3, the control sub-circuit 143 may include a first pull-down control transistor M8 and a second pull-down control transistor M9. The first pull-down control transistor M8 has a control electrode coupled to the pull-up control terminal Q, a first electrode coupled to the pull-down control terminal QB, and a second electrode coupled to the first power supply terminal VGL1. The second pull-down control transistor M9 has a control electrode coupled to the pull-down control terminal QB, a first electrode coupled to the pull-up control terminal Q, and a second electrode coupled to the first power supply terminal VGL1.

In the embodiment shown in FIG. 2, the input sub-circuit 141 includes a control signal input transistor M7, and the input sub-circuit 142 includes a control signal input transistor M10. As shown in FIG. 2, a control electrode and a first electrode of the control signal input transistor M7 are coupled to the first pull-down control clock terminal CLKM, and a second electrode of the control signal input transistor M7 is electrically coupled to the pull-down control terminal QB. A control electrode and a first electrode of the control signal input transistor M10 are coupled to the second pull-down control clock terminal CLKN, and a second electrode of the control signal input transistor M10 is electrically coupled to the pull-down control terminal QB.

In the present disclosure, the size of the control signal input transistor M7 is the same as the size of the control signal input transistor M10, but the width-to-length ratio of the control signal input transistor M7 is smaller than that of the first pull-down control transistor M8, so that the control of the voltage of the pull-down control terminal QB can be dominated by the first pull-down control transistor M8.

Specifically, in the output sub-phase t2, the pull-up control terminal Q is supplied with a high-level signal, the first pull-down control transistor M8 is turned on, and one of the control signal input transistors M7 and M10 of which the control electrode is supplied with an active voltage level is turned on, and a low-level signal provided by the first power supply terminal VGL1 is provided to the pull-down control terminal QB under the voltage division of the control signal input transistor M7/M10 and the first pull-down control transistor M8, so that it is possible to ensure disconnection between the second power supply terminal VGL2 and the signal output terminal OUT.

In the pull-down sub-phase 3, the voltage of the pull-up control terminal Q is pulled down by the reset circuit 150 or 160. Further, the active pull-down control clock signal provided to the pull-down control terminal QB through the input sub-circuit causes the output circuit 130 to provide a low level signal to signal output terminals such as the cascade output terminal CR and the scan signal output terminal OUT. In addition, since the gate electrode of the second pull-down control transistor M9 is supplied with the active pull-down control clock signal, the second pull-down control transistor M9 is turned on, and the pull-up control terminal Q is further pulled down and denoised by the signal provided by the first power supply terminal VGL1.

Figure 4:
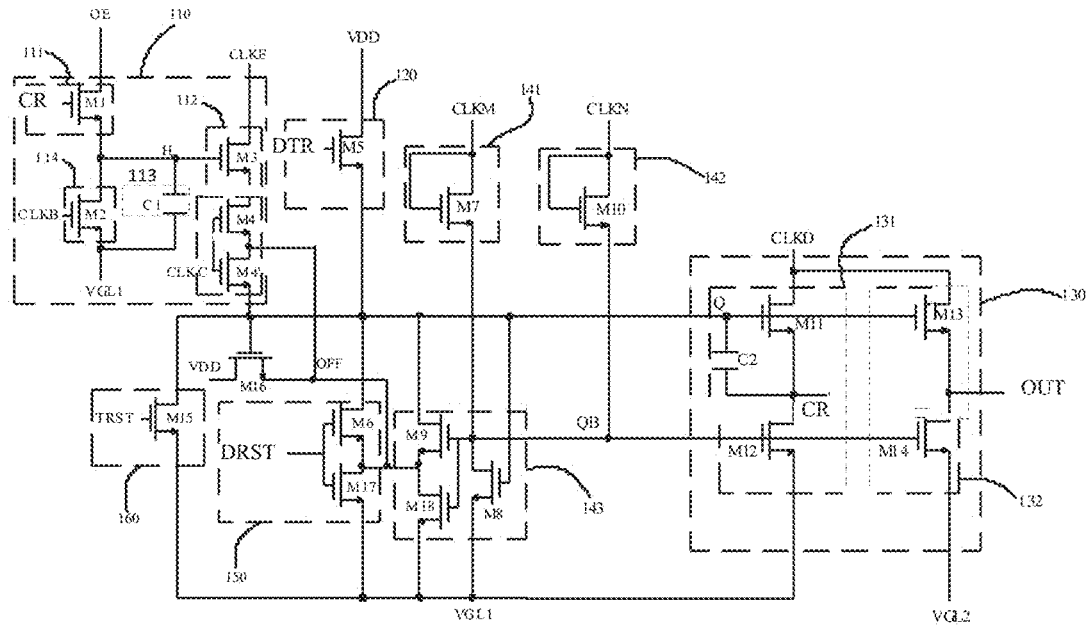
FIG. 4 is a circuit diagram of a shift register according to the present disclosure.
Figure 5:
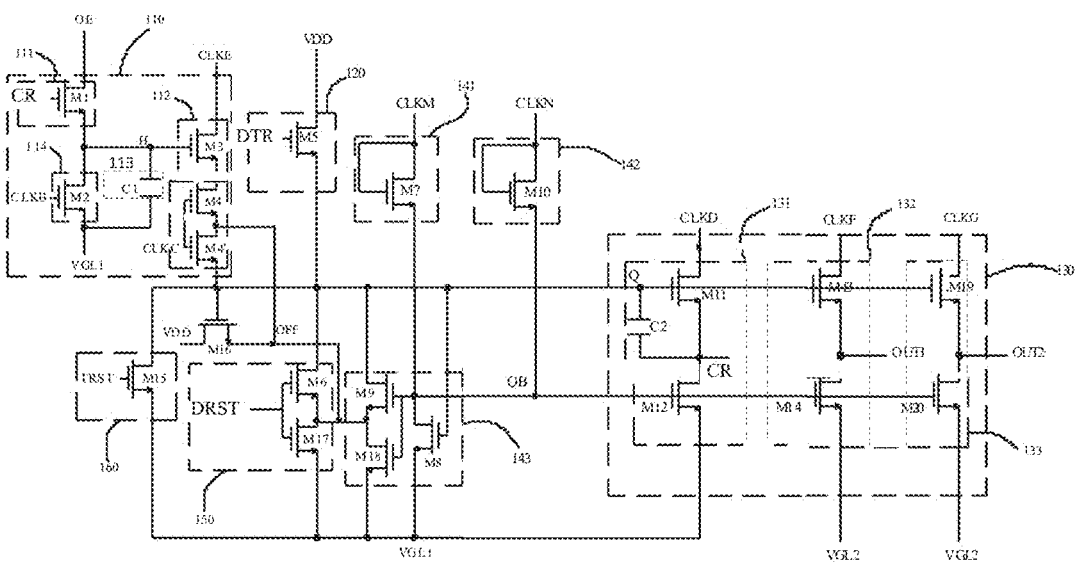
FIG. 5 is a circuit diagram of a shift register according to the present disclosure.

In order to prevent the pull-down control circuit 140 from unnecessarily discharging the pull-up control terminal Q in the output sub-phase t2, in some embodiments, as shown in FIGS. 4 and 5, the pull-down control sub-circuit 143 further includes a first leakage prevention transistor M18, and the second electrode of the second pull-down control transistor M9 is coupled to a first electrode of the pull-down control leakage prevention transistor M18 instead of the first power supply terminal VGL1. A control electrode of the pull-down control leakage prevention transistor M18 is coupled to the pull-down control terminal QB, and a second electrode of the pull-down control leakage prevention transistor is coupled to the first power supply terminal VGL1.

In a case where an inactive signal is applied to the gate electrode of the second pull-down control transistor M9, the second pull-down control transistor M9 and the first leakage prevention transistor M18 are both turned off, thereby ensuring that the first power supply terminal VGL1 does not affect the potential of the pull-up control terminal Q.

In some embodiments, referring to FIGS. 2 and 3, the second reset circuit 150 includes a second reset transistor M6, a control electrode of the second reset transistor M6 is coupled to the second reset control terminal DRST, a first electrode of the second reset transistor M6 is coupled to the pull-up control terminal Q, and a second electrode of the second reset transistor M6 is coupled to the first power supply terminal VGL1.

By providing an active reset signal to the control electrode of the second reset transistor M6 during the pull-down sub-phase t3, the second reset transistor M6 can be turned on, and the signal of the first power supply terminal VGL1 is provided to the pull-up control terminal Q, such that the potential of the pull-up control terminal Q is pulled down, and the output circuit 130 will not provide an inactive signal to the signal output terminal.

In order to prevent the pull-up control terminal Q from being pulled down during the output sub-phase t2, in some embodiments, referring to FIGS. 4 and 5, the second reset sub-circuit 150 further includes a reset leakage prevention transistor M17, and the second electrode of the second reset transistor M6 is coupled to a first electrode of the reset leakage prevention transistor M17, a control electrode of the reset leakage prevention transistor M17 is coupled to the second reset control terminal DRST, and a second electrode of the reset leakage prevention transistor M17 is coupled to the first power supply terminal VGL1.

In the present disclosure, when the control electrode of the reset leakage prevention transistor M17 receives a reset control signal, the reset leakage prevention transistor M17 is turned on, and the second reset transistor M6 is turned on, so that the first power supply terminal VGL1 may be electrically connected to the pull-up control terminal Q.

In the output sub-phase t2, the control electrode of the second reset transistor M6 and the control electrode of the reset leakage prevention transistor M17 receive an inactive reset signal, so the second reset transistor M6 and the reset leakage prevention transistor M17 are turned off to ensure that the voltage of the pull-up control terminal Q is not pulled down.

In some embodiments, as shown in FIGS. 2-5, the first reset circuit 160 includes: a first reset transistor M15 having a control electrode coupled to the first reset control terminal TRST, a first electrode coupled to the pull-up control terminal Q, and a second electrode coupled to the first power supply terminal VGL1.

When the control electrode of the first reset transistor M15 receives an active control signal, the first reset transistor M15 is turned on, so as to electrically connect the first power supply terminal VGL1 and the pull-up control terminal Q thereby resetting the pull-up control terminal Q.

The first input circuit 110 may serve as a detection signal input circuit, the second input circuit 120 may serve as a display signal input circuit, and the shift register may be used in a display panel including an external detection circuit. The first input circuit 110 is configured to provide a detection trigger signal to the pull-up control terminal Q, and the second input circuit 120 is configured to provide a display trigger signal to the pull-up control terminal Q. Through the shift register according to the present disclosure, the superposition of the detection scan signal and the display scan signal can be realized.

It should be noted that the detection scan signal here is a signal for controlling the detection of each pixel unit by the external compensation circuit of the organic light emitting diode display panel.

The first input circuit 110 and the second input circuit 120 alternately (e.g., during the sub-phase t1 of the detection phase T2 and the sub-phase t1 of the display phase T1) provide the trigger signal to the pull-up control terminal Q.

In some embodiments, the first input circuit 110 includes a detection control sub-circuit 111, a detection input sub-circuit 112, and a detection storing sub-circuit 113.

The detection control sub-circuit 111 is coupled to the cascade output terminal CR, the detection trigger terminal OE, and the detection control node H, and configured to apply a signal provided by one of the cascade output terminal CR and the detection trigger terminal OE to the detection control node H in response to the other of the cascade output terminal CR and the detection trigger terminal OE receiving an active voltage level.

The detection input sub-circuit 112 is coupled to the detection control node H, the first input terminal CLKE, and the pull-up control terminal Q. and configured to apply a signal provided by the first input terminal CLKE to the pull-up control terminal Q in response to an active voltage level of the detection control node H.

The detection storing sub-circuit 113 is coupled to the detection control node H and the first power supply terminal VGL1, and configured to store a voltage at the detection control node H.

By controlling the voltage level of the detection control node H by the detection control sub-circuit 111, the timing at which the detection input sub-circuit 112 supplies a signal to the pull-up control terminal can be controlled.

In some embodiments, the first input circuit 110 further includes: a detection reset sub-circuit 114 coupled to the detection control node H, the detection reset terminal CLKB, and the first power supply terminal VGL1, and configured to supply the first power supply signal to the detection control node H in response to the voltage of the detection reset terminal CLKB.

In the embodiment provided by the present disclosure, an active signal is provided to the detection reset terminal CLKB during the pull-down sub-phase t3 of the detection phase T2.

By the detection reset sub-circuit 114, the first power supply signal can be applied to the detection control node H in the pull-down sub-phase of the detection phase, thereby making the discharging of the detection control node H more sufficient.

As described above, the signal output from the signal output terminal includes the display scan signal and the detection scan signal. The signal input to the first input circuit 110 is a signal output through the cascade output terminal CR, which is identical in waveform to a signal including a display scan signal output by the scan signal output terminal. The output of the first input circuit 110 is controlled by the display scan signal, which can reduce power consumption and simplify circuit structure.

Figure 9:
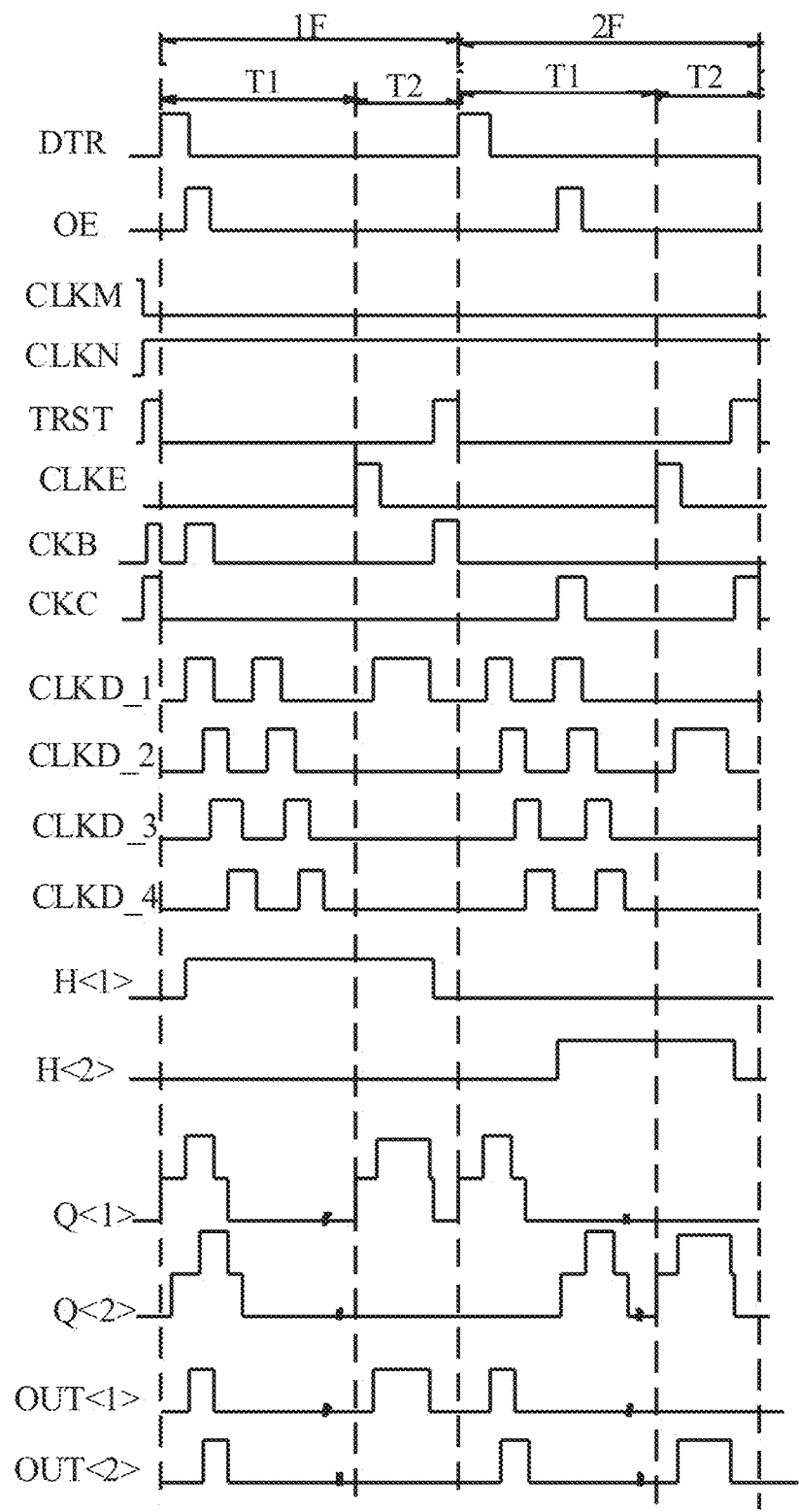
FIG. 9 is a signal timing diagram for driving the gate driving circuit.

In some embodiments, referring to FIGS. 6 and 9, a high level detection trigger signal is input through the detection trigger terminal OE for a certain period of time in the display phase T1. According to the embodiment of the present disclosure, in a GOA circuit composed of a plurality of cascaded shift registers, when a high level signal is input through a detection trigger terminal OE while a display scan signal output by the current stage of shift register is at high level, detection and compensation operations are performed on the current stage of shift register in a corresponding detection phase, that is, the current stage of shift register is selected among the plurality of stages of shift registers for detection and compensation. In this way, the detection trigger signal input through the detection trigger terminal OE can be set (for example, set to perform a non-progressive scan) to perform random detection and compensation simultaneously with progressive display scan, thereby avoiding the problems caused by progressive detection and compensation.

In some embodiments, referring to FIG. 2, the detection control sub-circuit 111 includes a detection control transistor M1. A control electrode of the detection control transistor M1 is coupled to the detection trigger terminal OE, a first electrode of the detection control transistor is coupled to the cascade output terminal CR, and a second electrode of the detection control transistor is coupled to the detection control node H.

In some embodiments, referring to FIGS. 3-5, the detection control sub-circuit 111 includes a detection control transistor M1. A control electrode of the detection control transistor M1 is coupled to the cascade output terminal CR, a first electrode of the detection control transistor is coupled to the detection trigger terminal OE, and a second electrode of the detection control transistor is coupled to the detection control node H.

In some embodiments, referring to FIGS. 2 and 3, the detection input sub-circuit 112 includes a detection input transistor M3 and a switching transistor M4. A control electrode of the detection input transistor M3 is coupled to the detection control node H, a first electrode of the detection input transistor M3 is coupled to the first input terminal CLKE, and a second electrode of the detection input transistor M3 is coupled to a first electrode of the switching transistor M4. A control electrode of the switching transistor M4 is coupled to the first input terminal CLKE, and a second electrode of the switching transistor M4 is coupled to the pull-up control terminal Q.

By setting the switching transistor M4 and making the switching transistor M4 off in the period in which the display scan signal is output, it is possible to avoid the signal stored in the detection storing sub-circuit 113 from affecting the potential of the pull-up control terminal Q.

Since the detection input sub-circuit 112 is coupled to the first input terminal CLKE for providing the clock signal instead of the signal terminal (e.g., VDD) for providing a constant high level, the voltage level of the second electrode of the transistor M3 may be higher under the influence of, for example, the gate-source capacitance of the transistor M3, so that the voltage level of the pull-up control terminal Q is higher, which may improve the stability of the shift register in operation.

In some embodiments, referring to FIGS. 4 and 5, the detection input sub-circuit 112 includes a detection input transistor M3, a switching transistor M4, and a detection leakage prevention transistor M4'. A control electrode of the detection input transistor M3 is coupled to the detection control node H, a first electrode of the detection input transistor M3 is coupled to the first input terminal CLKE, and a second electrode of the detection input transistor M3 is coupled to a first electrode of the switching transistor M4. A control electrode of the switching transistor M4 is coupled to the detection clock terminal CLKC, and a second electrode of the switching transistor M4 is coupled to a first electrode of the detection leakage prevention transistor M4'. A control electrode of the detection leakage prevention transistor M4' is coupled to the detection clock terminal CLKC, and the second electrode of the detection leakage prevention transistor M4' is coupled to the pull-up control terminal Q. In this case, an active voltage level needs to be provided through the detection clock terminal CLKC during the charging sub-phase t1 of the detection phase T2. The voltage levels of the detection clock terminal CLKC during other time periods may be as shown with reference to FIGS. 6 and 9.

In the present disclosure, in the charging sub-phase t1 of the detection phase T2, the voltage level of the detection control node H is at a high level, and a high level voltage is applied to the control electrode of the switching transistor M4 through the detection clock terminal CLKC or the first input terminal CLKE. At this time, the detection input transistor M3 and the switching transistor M4 (and, in the example of FIGS. 4-5, the detection leakage prevention transistor M4') are turned on, so that the active signal provided by the first input terminal CLKE can be output to the pull-up control terminal Q.

The switching transistor M4 and the detection leakage prevention transistor M4' may be controlled synchronously, and when the control electrode of the switching transistor M4 and the control electrode of the detection leakage prevention transistor M4' receive active control signals, the switching transistor M4 and the detection leakage prevention transistor M4' may be both turned on, thereby allowing the detection input sub-circuit 112 to provide the signal of the first input terminal CLKE to the pull-up control terminal Q.

When the control electrodes of the switching transistor M4 and the detection leakage prevention transistor M4' receive inactive control signals, the switching transistor M4 and the detection leakage prevention transistor M4' are both turned off, thereby avoiding the influence on the potential of the pull-up control terminal Q.

In some embodiments, the detection reset sub-circuit 114 includes a detection reset transistor M2, a control electrode of the detection reset transistor M2 is coupled to the detection reset terminal CLKB, a first electrode of the detection reset transistor M2 is coupled to the detection control node H, and a second electrode of the detection reset transistor M2 is coupled to the first power supply terminal VGL1.

When the control electrode of the detection reset transistor M2 receives an active reset signal, the detection reset transistor M2 is turned on, so that the detection control node H can be discharged.

In some embodiments, the second input circuit 120 includes a fifth transistor M5 having a control electrode coupled to the display trigger terminal DTR, a first electrode coupled to the third power supply terminal VDD, and a second electrode coupled to the pull-up control terminal Q.

In some embodiments, in a case where the shift register includes at least one of the detection leakage prevention transistor M4', the reset leakage prevention transistor M17, and the pull-down control leakage prevention transistor M18, in order to prevent electric leakage at nodes such as the first electrode of the detection leakage prevention transistor M4', the first electrode of the reset leakage prevention transistor M17, and/or the first electrode of the pull-down control leakage prevention transistor M18 (e.g., the intermediate leakage prevention node OFF in FIGS. 4 and 5), the shift register further includes an intermediate leakage prevention transistor M16, a control electrode of the intermediate leakage prevention transistor M16 is electrically coupled to the pull-up control terminal Q, a first electrode of the intermediate leakage prevention transistor M16 is electrically coupled to the third power supply terminal VDD, and a second electrode of the intermediate leakage prevention transistor M16 is electrically coupled to the first electrode of the detection leakage prevention transistor M4', the first electrode of the reset leakage prevention transistor M17, and/or the first electrode of the pull-down control leakage prevention transistor M18 (e.g., the intermediate leakage prevention node OFF in FIGS. 4 and 5). Alternatively (not shown in the drawings), the first electrode of the intermediate leakage prevention transistor M16 may be coupled to the pull-up control terminal Q instead of the third power supply terminal VDD.

In the present disclosure, the specific structure of the output circuit 130 is not particularly limited, and in order to ensure the stability of the signals, in some embodiments, the output circuit 130 includes a cascade output sub-circuit and at least one scan signal output sub-circuit, and different output sub-circuits provide two output signals having the same waveform, respectively, thereby avoiding the influence of other signals on the scan signal output by the scan signal output terminal OUT.

In the embodiment shown in FIGS. 2 to 4, the output circuit 130 includes one cascade output sub-circuit 131 and one scan signal output sub-circuit 132. In the embodiment shown in FIG. 5, the output sub-circuit 130 includes a cascade output sub-circuit 131 and two scan signal output sub-circuits 132.

In some embodiments, the cascade output sub-circuit 131 includes: a cascade output pull-up transistor M11, a cascade output pull-down transistor M12, and a pull-up control capacitor C2. A control electrode of the cascade output pull-up transistor M11 is coupled to the pull-up control terminal Q, a first electrode of the cascade output pull-up transistor M11 is coupled to the output clock signal terminal CLKD, and a second electrode of the cascade output pull-up transistor M11 is coupled to the cascade output terminal CR A control electrode of the cascade output pull-down transistor M12 is coupled to the pull-down control terminal QB, a first electrode of the cascade output pull-down transistor M12 is coupled to the first power supply terminal VGL1, and a second electrode of the cascade output pull-down transistor M12 is coupled to the cascade output terminal CR. A first electrode of the pull-up control capacitor C2 is coupled to the pull-up control terminal Q and a second electrode of the pull-up control capacitor C2 is coupled to the cascade output terminal CR.

Due to the bootstrap effect of the pull-up control capacitor C2, the potential of the pull-up control terminal Q can be raised. For example, referring to FIG. 6, in the output sub-phase t2, the pull-up control terminal Q is floating, the transistor M11 is turned on, and the potential of the pull-up control terminal Q may be coupled to a higher potential due to the bootstrap effect of the pull-up control capacitor C2.

In some embodiments, each scan signal output sub-circuit 132 includes: a scan output pull-up transistor and a scan output pull-down transistor. A control electrode of the scan output pull-up transistor is coupled to a pull-up control terminal Q, a first electrode of the scan output pull-up transistor is coupled to the output clock signal terminal, and a second electrode of the scan output pull-up transistor is coupled to the scan signal output terminal. A control electrode of the scan output pull-down transistor is coupled to the pull-down control terminal QB, a first electrode of the scan output pull-down transistor is coupled to the second power supply terminal VGL2, and a second electrode of the scan output pull-down transistor is coupled to the scan signal output terminal.

In some embodiments, for example, referring to FIGS. 2-4, the cascade output sub-circuit 131 and the scan signal output sub-circuit 132 are coupled to a single output clock signal terminal CLKD.

In some embodiments, for example, referring to FIG. 5, there are a plurality of output clock signal terminals (e.g., CLKD, CLKF, CLKG, etc. shown in FIG. 5), and the cascade output sub-circuit 131 and the plurality of scan signal output sub-circuits 132 are coupled to different output clock signal terminals.

In the embodiment shown in FIGS. 2 to 4, the output circuit 130 has one scan signal output sub-circuit 132, a control electrode of the scan output pull-up transistor M13 is coupled to the pull-up control terminal Q, a first electrode of the scan output pull-up transistor M13 is coupled to the output clock signal terminal, and a second electrode of the scan output pull-up transistor M13 is coupled to the scan signal output terminal OUT. A control electrode of the scan output pull-down transistor M14 is coupled to the pull-down control terminal QB, a first electrode of the scan output pull-down transistor M14 is coupled to the second power supply terminal VGL2, and a second electrode of the scan output pull-down transistor M14 is coupled to the scan signal output terminal OUT.

In the embodiment shown in FIG. 5, the output circuit 130 has two scan signal output sub-circuits 132, and has two scan signal output terminals OUT1 and OUT2. A control electrode of the scan output pull-up transistor M13 is coupled to the pull-up control terminal Q, a first electrode of the scan output pull-up transistor M13 is coupled to the output clock signal terminal CLKF, and a second electrode of the scan output pull-up transistor M13 is coupled to the scan signal output terminal OUT1. A control electrode of the scan output pull-down transistor M14 is coupled to the pull-down control terminal QB, a first electrode of the scan output pull-down transistor M14 is coupled to the second power supply terminal VGL2, and a second electrode of the scan output pull-down transistor M14 is coupled to the scan signal output terminal OUT1. A control electrode of the scan output pull-up transistor M19 is coupled to the pull-up control terminal Q, a first electrode of the scan output pull-up transistor M19 is coupled to the output clock signal terminal CLKG, and a second electrode of the scan output pull-up transistor M19 is coupled to the scan signal output terminal OUT2. A control electrode of the scan output pull-down transistor M20 is coupled to the pull-down control terminal QB, a first electrode of the scan output pull-down transistor M20 is coupled to the second power supply terminal VGL2, and a second electrode of the scan output pull-down transistor M20 is coupled to the scan signal output terminal OUT2.

In the present disclosure, the level of the low-level signal provided by the second power supply terminal VGL2 is generally higher than that of the low-level signal provided by the first power supply terminal VGL1, so that the signal output from the signal output terminal can be lossless.

In a second aspect, there is provided a gate driving circuit including a plurality of stages of cascaded shift registers, the shift registers each being the above shift register according to the present disclosure.

The so-called "cascade" means that, the output terminal (e.g., a cascade output terminal) of the current stage (e.g., N-th stage) of shift register is electrically coupled to the display trigger terminal (e.g., the display trigger terminal DTR in the above-described embodiment) of the next second stage (e.g., (n+2)-th stage) of shift register. According to the embodiments of the present disclosure, the signal output from the output terminal of the shift register may be used to drive a thin film transistor coupled to a gate line to be turned on or off, and may be used to drive an external circuit to perform detection and compensation.

Figure 7:
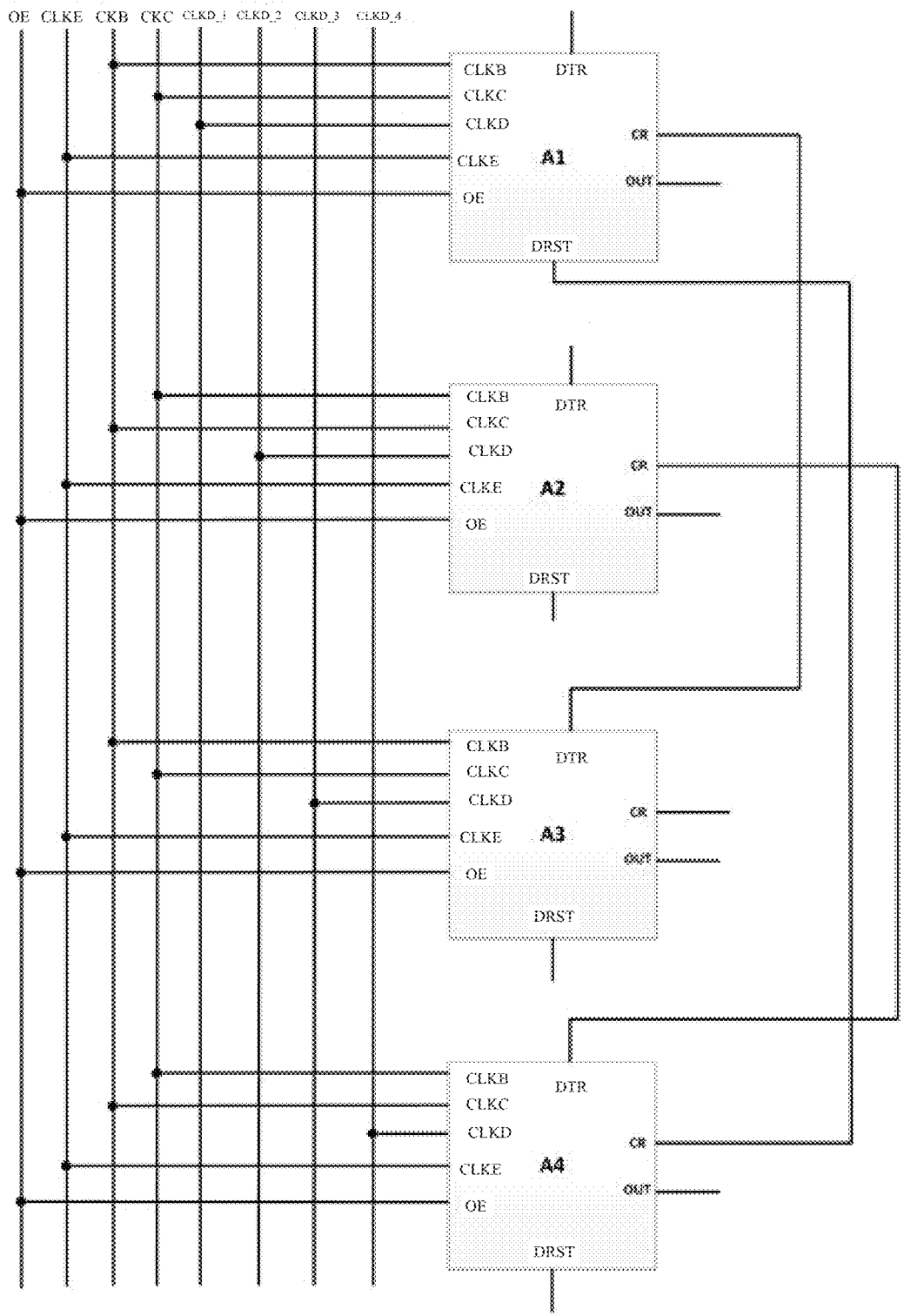
FIG. 7 is a block diagram of a gate driving circuit according to the present disclosure.

In some embodiments, the cascade output terminal CR of the (4n+1)-th stage of shift register (e.g., the first stage of shift register A1 in FIG. 7) is coupled to the display trigger terminal DTR of the (4n+3)-th stage of shift register (e.g., the third stage of shift register A3 in FIG. 7), the output clock signal terminal CLKD of the (4n+1)-th stage of shift register is coupled to the first output clock signal line CLKD_1 for supplying the first output clock signal, and the second reset control terminal DRST of the (4n+1)-th stage of shift register is coupled to the cascade output terminal CR of the (4n+4)-th stage of shift register (e.g., the fourth stage of shift register A4 in FIG. 7).

The cascade output terminal CR of the (4n+2)-th stage of shift register (e.g., the second stage of shift register A2 in FIG. 7) is coupled to the display trigger terminal DTR of the (4n+4)-th stage of shift register (e.g., the fourth stage of shift register A4 in FIG. 7), the output clock signal terminal CLKD of the (4n+2)-th stage of shift register is coupled to the second output clock signal line CLKD_2 for supplying the second output clock signal, and the second reset control terminal DRST of the (4n+2)-th stage of shift register is coupled to the cascade output terminal CR of the (4n+5)-th stage of shift register (e.g., the fifth stage of shift register, not shown in the figure).

The cascade output terminal CR of the (4n+3)-th stage of shift register (e.g., the third stage of shift register A3 in FIG. 7) is coupled to the display trigger terminal of the (4n+5)-th stage of shift register (e.g., the fifth stage of shift register, not shown in the figure), the output clock signal terminal CLKD of the (4n+3)-th stage of shift register is coupled to the third output clock signal line CLKD_3 for supplying the third output clock signal, and the second reset control terminal DRST of the (4n+3)-th stage of shift register is coupled to the cascade output terminal CR of the (4n+6)-th stage of shift register (e.g., the sixth stage of shift register, not shown in the figure).

The cascade output terminal CR of the (4n+4)-th stage of shift register (e.g., the fourth stage of shift register A4 in FIG. 7) is coupled to the display trigger terminal DTR of the (4n+6)-th stage of shift register (e.g., the sixth stage of shift register, not shown in the figure), the output clock signal terminal of the (4n+4)-th stage of shift register is coupled to the fourth output clock signal line CLKD_4 for supplying the fourth output clock signal, and the second reset control terminal DRST of the (4n+4)-th stage of shift register is coupled to the cascade output terminal CR of the (4n+7)-th stage of shift register (e.g., the seventh stage of shift register, not shown in the figure).

Herein, n is an integer.

That is, for an N-th stage of shift register, its cascade output terminal is CR<N>, its display trigger terminal DTR is coupled to the cascade output terminal CR<N−2> of the (N−2)-th stage of shift register, and its second reset control terminal DRST is coupled to the cascade output terminal CR<N+2> of the (N+2)-th stage of shift register.

In some embodiments, referring to FIGS. 7 and 9, the detection reset terminal CLKB of the odd-numbered stage of shift register is coupled to the first detection reset clock line CKB, and the detection reset terminal CLKB of the even-numbered stage of shift register is coupled to the second detection reset clock line CKC. In addition, when the shift register is a shift register as shown in FIGS. 4 and 5, the detection clock terminal CLKC of the odd-numbered stage of shift register is coupled to the second detection reset clock line CKC, and the detection clock terminal CLKC of the even-numbered stage of shift register is coupled to the second detection reset clock line CKB.

As a third aspect of the present disclosure, there is provided a display device including a gate driving circuit, the gate driving circuit being the above gate driving circuit according to the present disclosure.

Figure 8:
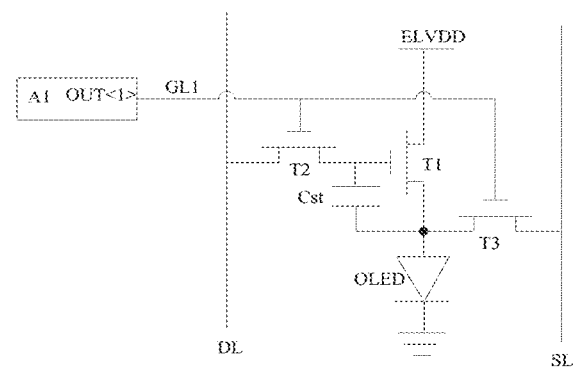
FIG. 8 is a schematic diagram of a pixel circuit in a pixel unit of a display panel according to the present disclosure.

The display panel includes a plurality of data lines, a plurality of gate lines and a plurality of detection lines, and the display panel is divided into a plurality of pixel units by the plurality of gate lines and the plurality of data lines. As shown in FIG. 8, a pixel circuit and a detection switching transistor T3 are provided for each pixel unit, and each pixel unit includes a data writing transistor 2. In the same row of pixel units, the gate electrodes of the data writing transistor T2 and the detection switching transistor T3 are electrically coupled to a respective one of the gate lines (e.g., in the embodiment shown in FIG. 8, the gate electrodes of the data writing transistor T2 and the detection switching transistor T3 are electrically coupled to the gate line GL1). When the gate line receives a display scan signal, the data writing transistor T2 is turned on, and data inputted through the corresponding data line DL can be written into the pixel circuit, driving the pixel unit to emit light. When the gate line receives the detection scan signal, the detection switching transistor T3 is turned on, so that the detection signal can be acquired through the detection signal line SL.

In the present disclosure, there is no particular limitation to a specific structure of the pixel circuit. For example, in the specific embodiment shown in FIG. 8, the pixel circuit includes a driving transistor T1, a data writing transistor T2, and an organic light emitting diode OLED. A first electrode of the data writing transistor T2 is electrically coupled to the corresponding data line DL, and a second electrode of the data writing transistor T2 is electrically coupled to the gate electrode of the driving transistor T1. A first electrode of the driving transistor T1 is electrically coupled to the high-level signal terminal ELVDD, a second electrode of the driving transistor T1 is electrically coupled to an anode electrode of the organic light emitting diode OLED, and a cathode electrode of the organic light emitting diode OLED is coupled to the ground.

The gate electrode of the detection switching transistor T3 is electrically coupled to the gate line GL1, a first electrode of the detection switching transistor T3 is electrically coupled to the anode electrode of the organic light emitting diode OLED, and a second electrode of the detection switching transistor T3 is electrically coupled to the detection signal line SL.

In a fourth aspect, there is provided a driving method of a shift register, the shift register being the shift register according to the present disclosure. The operation cycle of the shift register is divided into a display phase T1 and a detection phase T2 that are non-overlapping in time, and each of the display phase and the detection phase includes a first sub-phase t1, a second sub-phase t2, and a third sub-phase t3.

The driving method includes: in the first sub-phase t1 of the display phase T1, applying, by the second input circuit 120, an active signal provided by the second input terminal VDD to the pull-up control terminal Q in response to a signal of the display trigger terminal DTR; in the second sub-phase t2 of the display phase T1, the control and output circuit determining the voltage of the pull-down control terminal QB as an inactive voltage in response to the signal of the pull-up control terminal Q, and outputting the signal provided by the output clock signal terminal CLKD through the signal output terminals OUT and CR in response to the signal of the pull-up control terminal Q; in the third sub-phase t3 of the display phase T1, the second reset circuit 150 providing the inactive signal of the first power supply terminal VGL1 to the pull-up control terminal Q in response to the signal of the second reset control terminal DRST; in the first sub-phase t1 of the detection phase T2, the first input circuit 110 applying an active signal provided by the first input terminal CLKE to the pull-up control terminal Q in response to the signals of the detection trigger terminal OE and the signal output terminal CR; in the second sub-phase t2 of the detection phase T2, the control and output circuit determining the voltage of the pull-down control terminal QB as an inactive voltage in response to the signal of the pull-up control terminal Q. and outputting the signal provided by the output clock signal terminal CLKD through the signal output terminals OUT and CR in response to the signal of the pull-up control terminal Q; in the third sub-phase t3 of the detection phase T2, the first reset circuit 160 providing the inactive signal of the first power supply terminal VGL1 to the pull-up control terminal Q in response to the signal of the first reset control terminal TRST.

The driving process of the display device including the shift register as described above can be seen in FIG. 9, where the display device includes a gate driving circuit including a plurality of cascaded shift registers as described above, which are cascaded in the manner shown in FIG. 7. The driving process includes a plurality of frame periods (only the first two frame periods, the first frame period 1F and the second frame period 2F, are shown in FIG. 9), each of which includes a display phase T1 and a detection period T2.

The signal of the first detection reset clock line CKB to which the detection reset terminal CLKB of the odd-numbered stage of shift register is coupled and the signal of the second detection reset clock line CKC to which the detection reset terminal CLKB of the even-numbered stage of shift register is coupled are complementary, that is, the first detection reset clock line CKB provides a clock signal in the odd-numbered frame period, and provides a low level voltage throughout the even-numbered frame period, and the second detection reset clock line CKC provides a clock signal in the even-numbered frame period, and provides a low level voltage throughout the odd-numbered frame period. Signals provided by the first to fourth output clock signal lines CLKD_1, CLKD_2, CLKD_3, and CLKD_4 are sequentially delayed for a certain period of time such that the plurality of shift registers sequentially output display scan signals in one frame period, thereby realizing progressive display scan.

During different frame periods, signals of the detection trigger terminals of different stages of shift registers are controlled, respectively, such that in a preset number of frame periods, the detection input circuits of all the shift registers have output active signals to the pull-up control terminal in the detection phase.

It should be noted that, in the driving method according to the present disclosure, the detection phase T2 starts only after the last stage of shift register completes outputting the display scan signal.

In the display phase T1 of each frame period, the display trigger signal DTR is provided to the display input circuit 110 of the corresponding shift register, the first clock signal is provided to the output clock signal terminal CLKD of the shift register, and the display scan signal is output through the signal output terminal of the shift register.

During the detection phase T2 of each frame period, an active third clock signal is provided to the first input terminal CLKE of the corresponding shift register, and then a detection scan signal is output through the signal output terminal of the shift register.

During different frame periods, an active first clock signal is provided to the first clock signal terminals CLKD of different stages of shift registers, respectively, so that in a preset number of frame periods, all the shift registers have received the active first clock signal in the detection phase.

In the method according to the present disclosure, the first input circuit is controlled to store the initial trigger signal during the display phase T1. However, during the display phase, the signal provided by the first input terminal CLKE is an inactive signal, so that the detection input sub-circuit of the first input circuit is disconnected from the pull-up control terminal, thereby ensuring that the signal stored in the first input circuit does not affect the output of the display scan signal during the entire display phase TL.

The driving method according the present disclosure will be described with reference to FIGS. 2, 7 and 9.

As shown in FIG. 9, one period of the driving method is one frame of the display device, and a first frame period 1F and a second frame period 2F are shown in FIG. 9. As shown in FIG. 7, the gate driving circuit includes two shift register groups, one shift register group for the odd-numbered stages of shift registers and the other shift register group for the even-numbered stages of shift registers, and accordingly, in correspondence with the embodiment in FIG. 7, the gate driving circuit includes four first clock signal lines, which are the first output clock signal line CLKD_1 and the third output clock signal line CLKD_3 for supplying output clock signals to the odd-numbered stages of shift registers, and the second output clock signal line CLKD_2 and the fourth output clock signal line CLKD_4 for supplying output clock signals to the even-numbered stages of shift registers, respectively.

In FIG. 9, H<1> indicates the potential of the detection control node of the detection input circuit of the first stage of shift register, and H<2> indicates the potential of the detection control node of the detection input circuit of the second stage of shift register.

Each frame period of the driving method includes a display phase T1 and a detection period T2.

In the display phase T1 of the first frame period 1F, in the charging sub-phase t1, an active display trigger signal DTR (which is a high level signal in FIG. 7) is input through both the display trigger terminal of the first stage of shift register and the display trigger terminal of the second stage of shift register.

For the first stage of shift register A1, the operation during the display phase T1 may include operations in a charging sub-phase t1, an output sub-phase t2, and a pull-down sub-phase t3.

In the charging sub-phase t1, a high-level signal provided by the third power supply signal terminal VDD is written into the pull-up control terminal Q, so that both the cascade output pull-up transistor M11 and the scan output pull-up transistor M13 are turned on. At this time, the output clock signal terminal CLKD receives an inactive clock signal, and thus an inactive signal can be output through the output terminal OUT<1>. Since the control signal input transistor M7 is turned on, the voltage division of the control signal input transistor M7 and the first pull-down control transistor M8 makes the voltage level of the pull-down control terminal QB low, which ensures that the second pull-down control transistor M9 is turned off, and the cascade output pull-down transistor M12 and the scan output pull-down transistor M14 are turned off.

In the output sub-phase t2, the display trigger signal DTR is at a low level, and therefore, the fifth transistor M5 is turned off, so that the pull-up control terminal Q is floating, and the pull-up control terminal Q is coupled to a higher potential due to the bootstrap effect of the storage capacitor C2, thereby keeping the cascade output pull-up transistor M11 and the scan output pull-up transistor M13 on. At this time, an active clock signal is input through the output clock signal terminal CLKD, so that it can be ensured that an active signal is output through the signal output terminals (including the cascade output terminal CR and the scan signal output terminal OUT) during the output sub-phase t2. At this sub-phase, the voltage level of the pull-down control terminal QB is low due to the voltage division of the control signal input transistor M7 and the first pull-down control transistor M8, thereby ensuring that the cascade output pull-down transistor M12 and the scan output pull-down transistor M14 are turned off. In addition, the second pull-down control transistor M9 is ensured to be turned off, thereby preventing the pull-up control terminal Q from being pulled down.

In the pull-down sub-phase 3, the gate electrode of the second reset transistor M6 receives an active reset signal, so that the second reset transistor M6 is turned on, the potential of the pull-up control terminal Q is pulled down, and both the first pull-down control transistor M8 and the second pull-down control transistor M9 are turned off. The cascade output pull-down transistor M12 and the scan signal output pull-down transistor M14 are turned on due to the active signal input through the control signal input transistor M7, and thus the potentials of the cascade signal output terminal and the scan signal output terminal OUT<1> are both pulled down.

After the outputting of the last stage of shift register (e.g., the fourth stage of shift register A4 in the example of FIG. 7) finishes, the method proceeds to the detection phase T2. As shown in FIG. 9, an active first clock signal is provided to the first stage of shift register A1 through the clock signal terminal CLKD, and an active clock signal is provided to the gate electrode of the switching transistor M4 through the first input terminal CLKE, so that the switching transistor M4 is turned on, and a signal stored in the detection storing sub-circuit 113 (e.g., the storage capacitor C1 shown in FIG. 2) makes the detection input transistor M3 turned on to write the active signal provided by the first input terminal CLKE to the pull-up control terminal Q, so that the cascade output pull-up transistor M11 and the scan output pull-up transistor M13 are turned on, and thus, the first clock signal provided by the output clock signal terminal CLKD is output through the signal output terminal. After the outputting finishes, an active reset signal is provided to the gate electrode of the first reset transistor M15 through the reset control terminal TRST, so that the first reset transistor M15 is turned on, the potential of the pull-up control terminal Q is pulled down, and the first pull-down control transistor M8 is turned off, and at this time, the potential of the pull-down control terminal QB is high, and the low potential of the pull-up control terminal Q is further maintained. The cascade output pull-down transistor M12 and the scan output pull-down transistor M14 are turned on due to the high potential of the pull-down control terminal QB, and thus the potentials of the cascade signal output terminal and the scan signal output terminal OUT<1> are pulled down.

In the present disclosure, the proportion of the superposition of the output waveforms may be achieved by adjusting the pulse width of the first clock signal and the pulse width of the input signal.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present invention, and these variations and improvements shall also fall into the protection scope of the present disclosure.

What is claimed is:

1. A shift register, comprising:
a plurality of signal input circuits coupled to a plurality of signal input terminals, a plurality of input control terminals, and a pull-up control terminal;
a plurality of reset circuits, respectively coupled to a plurality of reset control terminals which are different from each other and in one-to-one correspondence with the plurality of reset circuits, and coupled to a first power supply terminal and the pull-up control terminal;
a control and output circuit coupled to the pull-up control terminal, a pull-down control terminal, an output power supply terminal, an output clock signal terminal, and a signal output terminal, and configured to determine a voltage of the pull-down control terminal according to a voltage of the pull-up control terminal, output a signal provided by the output clock signal terminal through the signal output terminal in response to the voltage of the pull-up control terminal, and output a signal provided by the output power supply terminal through the signal output terminal in response to the voltage of the pull-down control terminal, wherein an operation cycle of the shift register is divided into a plurality of phases, the plurality of phases are non-overlapping in time, and each of the plurality of phases comprises at least a first sub-phase and a second sub-phase, the plurality of signal input circuits are each configured to apply, during the first sub-phase of a respective one of the plurality of phases, a signal provided by a respective one of the plurality of signal input terminals to the pull-up control terminal in response to a signal of a respective one of the plurality of input control terminals, and the plurality of reset circuits are each configured to apply, during in the second sub-phase of a respective one of the plurality of phases, a first power supply signal provided by the first power supply terminal to the pull-up control terminal in response to a signal of a respective one of the plurality of reset control terminals, wherein the control and output circuit comprises:

a pull-down control circuit coupled to the pull-up control terminal, the pull-down control terminal, the first power supply terminal, and a pull-down control clock terminal, and configured to apply a signal provided by one of the first power supply terminal and the pull-down control clock terminal to the pull-down control terminal according to the voltage of the pull-up control terminal; and an output circuit coupled to the signal output terminal, the output power supply terminal, the output clock signal terminal, the pull-up control terminal, and the pull-down control terminal, and configured to output a signal provided by the output clock signal terminal through the signal output terminal in response to the voltage of the pull-up control terminal, and output the signal provided by the output power supply terminal through the signal output terminal in response to the voltage of the pull-down control terminal.

2. The shift register of claim 1, wherein the operation cycle of the shift register is divided into a detection phase and a display phase, the plurality of signal input circuits comprise a first input circuit and a second input circuit, the plurality of signal input terminals comprise a first input terminal and a second input terminal, and the signal output terminal comprises a cascade output terminal and a scan signal output terminal, the first input circuit is coupled to the cascade output terminal, a detection trigger terminal, the first input terminal, and the pull-up control terminal, and configured to apply, during a first sub-phase of the detection phase, a signal provided by the first input terminal to the pull-up control terminal in response to both the cascade output terminal and the detection trigger terminal receiving an active voltage level, and the second input circuit is coupled to a display trigger terminal, the second input terminal, and the pull-up control terminal, and configured to apply, during a first sub-phase of the display phase, a signal provided by the second input terminal to the pull-up control terminal in response to the display trigger terminal receiving an active voltage level.

3. The shift register of claim 2, wherein the first input circuit comprises:

a detection control sub-circuit coupled to the cascade output terminal, the detection trigger terminal, and a detection control node, and configured to apply a signal provided by one of the cascade output terminal and the detection trigger terminal to the detection control node in response to the other one of the cascade output terminal and the detection trigger terminal receiving an active voltage level;

a detection input sub-circuit coupled to the detection control node, the first input terminal, and the pull-up control terminal, and configured to apply a signal provided by the first input terminal to the pull-up control terminal in response to an active voltage level of the detection control node; and a detection storing sub-circuit coupled to the detection control node and the first power supply terminal, and configured to store a voltage at the detection control node.

4. The shift register of claim 3, wherein the detection control sub-circuit comprises a detection control transistor, a control electrode of the detection control transistor is coupled to the detection trigger terminal, a first electrode of the detection control transistor is coupled to the cascade output terminal, and a second electrode of the detection control transistor is coupled to the detection control node.

5. The shift register of claim 3, wherein the detection control sub-circuit comprises a detection control transistor, a control electrode of the detection control transistor is coupled to the cascade output terminal, a first electrode of the detection control transistor is coupled to the detection trigger terminal, and a second electrode of the detection control transistor is coupled to the detection control node.

6. The shift register of claim 3, wherein the detection input sub-circuit comprises: a detection input transistor and a switching transistor, a control electrode of the detection input transistor is coupled to the detection control node, a first electrode of the detection input transistor is coupled to the first input terminal, and a second electrode of the detection input transistor is coupled to a first electrode of the switching transistor, and a control electrode of the switching transistor is coupled to the first input terminal, and a second electrode of the switching transistor is coupled to the pull-up control terminal.

7. The shift register of claim 3, wherein the first input circuit further comprises:

a detection reset sub-circuit coupled to the detection control node, a detection reset terminal, and the first power supply terminal, and configured to provide the first power supply signal to the detection control node in response to a voltage of the detection reset terminal.

8. The shift register of claim 7, wherein the detection reset sub-circuit comprises a detection reset transistor having a control electrode coupled to the detection reset terminal, a first electrode coupled to the detection control node, and a second electrode coupled to the first power supply terminal.

9. The shift register of claim 3, wherein the detection input sub-circuit comprises: a detection input transistor, a switching transistor, and a detection leakage prevention transistor, a control electrode of the detection input transistor is coupled to the detection control node, a first electrode of the detection input transistor is coupled to the first input terminal, and a second electrode of the detection input transistor is coupled to a first electrode of the switching transistor, a control electrode of the switching transistor is coupled to a detection clock terminal, and a second electrode of the switching transistor is coupled to a first electrode of the detection leakage prevention transistor, and a control electrode of the detection leakage prevention transistor is coupled to the detection clock terminal, the first electrode of the detection leakage prevention transistor is coupled to an intermediate leakage prevention node, and a second electrode of the detection leakage prevention transistor is coupled to the pull-up control terminal.

10. The shift register of claim 9, further comprising an intermediate leakage prevention transistor having a control electrode coupled to the pull-up control terminal, a first electrode electrically coupled to a third power supply terminal or the pull-up control terminal, and a second electrode coupled to the intermediate leakage prevention node.

11. The shift register of claim 1, wherein the operation cycle of the shift register is divided into a detection phase and a display phase, the plurality of signal input terminals comprise a first input terminal and a second input terminal, and the signal output terminal comprises a cascade output terminal and a scan signal output terminal, the plurality of reset circuits comprise a first reset circuit and a second reset circuit, and the plurality of reset control terminals comprise a first reset control terminal and a second reset control terminal, the first reset circuit is coupled to the first reset control terminal, the first power supply terminal and the pull-up control terminal, and configured to provide, during a second sub-phase of the detection phase, the first power supply signal to the pull-up control terminal in response to a voltage of the first reset control terminal, the second reset circuit is coupled to the second reset control terminal, the first power supply terminal, and the pull-up control terminal, and configured to provide, during a second sub-phase of the display phase, the first power supply signal to the pull-up control terminal in response to a voltage of the second reset control terminal.

12. The shift register of claim 11, wherein the output power supply terminal comprises a second power supply terminal and the first power supply terminal, and the output circuit comprises:
  a cascade output sub-circuit coupled to the cascade output terminal, the output clock signal terminal, the pull-up control terminal, the pull-down control terminal, and the first power supply terminal, and configured to output a signal provided by the output clock signal terminal through the cascade output terminal in response to the voltage of the pull-up control terminal and output the signal provided by the first power supply terminal through the cascade output terminal in response to the voltage of the pull-down control terminal, and
  at least one scan signal output sub-circuit coupled to the scan signal output terminal, the output clock signal terminal, the pull-up control terminal, the pull-down control terminal, and the second power supply terminal, and configured to output a signal provided by the output clock signal terminal through the scan signal output terminal in response to the voltage of the pull-up control terminal and output a signal provided by the second power supply terminal through the scan signal output terminal in response to the voltage of the pull-down control terminal, wherein the cascade output sub-circuit comprises: a cascade output pull-up transistor, a cascade output pull-down transistor and a pull-up control capacitor, a control electrode of the cascade output pull-up transistor is coupled to the pull-up control terminal, a first electrode of the cascade output pull-up transistor is coupled to the output clock signal terminal, and a second electrode of the cascade output pull-up transistor is coupled to the cascade output terminal, a control electrode of the cascade output pull-down transistor is coupled to the pull-down control terminal, a first electrode of the cascade output pull-down transistor is coupled to the first power supply terminal, and a second electrode of the cascade output pull-down transistor is coupled to the cascade output terminal, and a first electrode of the pull-up control capacitor is coupled to the pull-up control terminal, and a second electrode of the pull-up control capacitor is coupled to the cascade output terminal, wherein the scan signal output sub-circuit comprises a scan output pull-up transistor and a scan output pull-down transistor, a control electrode of the scan output pull-up transistor is coupled to the pull-up control terminal, a first electrode of the scan output pull-up transistor is coupled to the output clock signal terminal, and a second electrode of the scan output pull-up transistor is coupled to the scan signal output terminal, and a control electrode of the scan output pull-down transistor is coupled to the pull-down control terminal, a first electrode of the scan output pull-down transistor is coupled to the second power supply terminal, and a second electrode of the scan output pull-down transistor is coupled to the scan signal output terminal.

13. The shift register of claim 11, wherein the first reset circuit and the second reset circuit satisfy one of (1) and (2),
  (1) the first reset circuit comprises a first reset transistor having a control electrode coupled to the first reset control terminal, a first electrode coupled to the pull-up control terminal, and a second electrode coupled to the first power supply terminal, and the second reset circuit comprises a second reset transistor having a control electrode coupled to the second reset control terminal, a first electrode coupled to the pull-up control terminal, and a second electrode coupled to the first power supply terminal,
  (2) the first reset circuit comprises a first reset transistor having a control electrode coupled to the first reset control terminal, a first electrode coupled to the pull-up control terminal, and a second electrode coupled to the first power supply terminal, the second reset circuit comprises a second reset transistor and a reset leakage prevention transistor, a control electrode of the second reset transistor is coupled to the second reset control terminal, a first electrode of the second reset transistor is coupled to the pull-up control terminal, a second electrode of the second reset transistor is coupled to a first electrode of the reset leakage prevention transistor, a control electrode of the reset leakage prevention transistor is coupled to the second reset control terminal, the first electrode of the reset leakage prevention transistor is coupled to an intermediate leakage prevention node, and a second electrode of the reset leakage prevention transistor is coupled to the first power supply terminal.

14. A gate driving circuit, comprising a plurality of stages of cascaded shift registers, the shift registers each being the shift register of claim 11,
wherein among the plurality of stages of cascaded shift registers,
the cascade output terminal of the (4n+1)-th stage of shift register is coupled to the display trigger terminal of the (4n+3)-th stage of shift register, the output clock signal terminal of the (4n+1)-th stage of shift register is coupled to a first output clock signal line for providing a first output clock signal, and the second reset control terminal of the (4n+1)-th stage of shift register is coupled to the cascade output terminal of the (4n+4)-th stage of shift register,
the cascade output terminal of the (4n+2)-th stage of shift register is coupled to the display trigger terminal of the (4n+4)-th stage of shift register, the output clock signal terminal of the (4n+2)-th stage of shift register is coupled to a second output clock signal line for providing a second output clock signal, and the second reset control terminal of the (4n+2)-th stage of shift register is coupled to the cascade output terminal of the (4n+5)-th stage of shift register,
the cascade output terminal of the (4n+3)-th stage of shift register is coupled to the display trigger terminal of the (4n+5)-th stage of shift register, the output clock signal terminal of the (4n+3)-th stage of shift register is coupled to a third output clock signal line for providing a third output clock signal, and the second reset control terminal of the (4n+3)-th stage of shift register is coupled to the cascade output terminal of the (4n+6)-th stage of shift register,
the cascade output terminal of the (4n+4)-th stage of shift register is coupled to the display trigger terminal of the (4n+6)-th stage of shift register, the output clock signal terminal of the (4n+4)-th stage of shift register is coupled to a fourth output clock signal line for supplying a fourth output clock signal, and the second reset control terminal of the (4n+4)-th stage of shift register is coupled to the cascade output terminal of the (4n+7)-th stage of shift register.

15. The shift register of claim 11, wherein the pull-down control circuit comprises:
at least one pull-down control input sub-circuit coupled to the pull-down control clock terminal and the pull-down control terminal, and configured to apply a signal provided by the pull-down control clock terminal to the pull-up control terminal; and
a control sub-circuit coupled to the pull-up control terminal, the pull-down control terminal, and the first power supply terminal, and configured to determine the voltage of the pull-down control terminal as a voltage provided by one of the first power supply terminal and the pull-down control clock terminal according to the voltage of the pull-up control terminal.

16. The shift register of claim 15, wherein the control sub-circuit comprises a first pull-down control transistor and a second pull-down control transistor,
a control electrode of the first pull-down control transistor is coupled to the pull-up control terminal, a first electrode of the first pull-down control transistor is coupled to the pull-down control terminal, and a second electrode of the first pull-down control transistor is coupled to the first power supply terminal, and a control electrode of the second pull-down control transistor is coupled to the pull-down control terminal, a first electrode of the second pull-down control transistor is coupled to the pull-up control terminal, and a second electrode of the second pull-down control transistor is coupled to the first power supply terminal.

17. The shift register of claim 15, wherein the control sub-circuit comprises a first pull-down control transistor, a second pull-down control transistor, and a pull-down control leakage prevention transistor,
a control electrode of the first pull-down control transistor is coupled to the pull-up control terminal, a first electrode of the first pull-down control transistor is coupled to the pull-down control terminal, and a second electrode of the first pull-down control transistor is coupled to the first power supply terminal,
a control electrode of the second pull-down control transistor is coupled to the pull-down control terminal, a first electrode of the second pull-down control transistor is coupled to the pull-up control terminal, and a second electrode of the second pull-down control transistor is coupled to a first electrode of the pull-down control leakage prevention transistor, and
a control electrode of the pull-down control leakage prevention transistor is coupled to the pull-down control terminal, and a second electrode of the pull-down control leakage prevention transistor is coupled to the first power supply terminal.

18. The shift register of claim 15, wherein the pull-down control clock terminal comprises a plurality of pull-down control clock terminals through which an active signal is provided at different phases, and
the pull-down control circuit comprises a plurality of pull-down control input sub-circuits, each of which is coupled to the pull-down control terminal and one of the pull-down control clock terminals, and configured to apply the signal provided by the pull-down control clock terminal to the pull-down control terminal in response to the pull-down control clock terminal receiving an active signal.

19. The shift register of claim 18, wherein each of the pull-down control input sub-circuits comprises a pull-down control input transistor, and
a control electrode and a first electrode of the pull-down control input transistor are coupled to one of the pull-down control clock terminals, and a second electrode of the pull-down control input transistor is coupled to the pull-down control terminal.

20. A driving method of a shift register,
wherein the shift register comprises:
a first input circuit coupled to a signal output terminal, a detection trigger terminal, a first input terminal and a pull-up control terminal;
a second input circuit coupled to a display trigger terminal, a second input terminal and the pull-up control terminal;
a first reset circuit and a second reset circuit, the first reset circuit being coupled to a first reset control terminal, a first power supply terminal, and the pull-up control terminal, the second reset circuit being coupled to a second reset control terminal, the first power supply terminal, and the pull-up control terminal;
a control and output circuit coupled to the pull-up control terminal, a pull-down control terminal, an output power supply terminal, an output clock signal terminal, and an output signal terminal, wherein an operation cycle of the shift register is divided into a display phase and a detection phase that are non-overlapping in time, and each of the display phase and the detection phase comprises a first sub-phase, a second sub-phase, and a third sub-phase, and the driving method comprises:

in the first sub-phase of the display phase, applying, by the second input circuit, an active signal provided by the second input terminal to the pull-up control terminal in response to a signal of the display trigger terminal;

in the second sub-phase of the display phase, determining, by the control and output circuit, a voltage of the pull-down control terminal as an inactive voltage in response to a signal of the pull-up control terminal, and outputting a signal provided by the output clock signal terminal through the signal output terminal in response to the signal of the pull-up control terminal;

in the third sub-phase of the display phase, providing, by the second reset circuit, an inactive signal of the first power supply terminal to the pull-up control terminal in response to a signal of the second reset control terminal;

in the first sub-phase of the detection phase, applying, by the first input circuit, an active signal provided by the first input terminal to the pull-up control terminal in response to signals of the detection trigger terminal and the signal output terminal;

in the second sub-phase of the detection phase, determining, by the control and output circuit, the voltage of the pull-down control terminal as an inactive voltage in response to the signal of the pull-up control terminal, and outputting the signal provided by the output clock signal terminal through the signal output terminal in response to the signal of the pull-up control terminal; and in the third sub-phase of the detection phase, providing, by the first reset circuit, the inactive signal of the first power supply terminal to the pull-up control terminal in response to a signal of the first reset control terminal.

* * * * *